US010509371B2

(12) United States Patent
Hanada et al.

(10) Patent No.: US 10,509,371 B2
(45) Date of Patent: Dec. 17, 2019

(54) INFORMATION NOTIFICATION METHOD, INFORMATION NOTIFICATION DEVICE, AND NON-TRANSITORY RECORDING MEDIUM

(71) Applicant: CASIO COMPUTER CO., LTD., Tokyo (JP)

(72) Inventors: Takeshi Hanada, Tachikawa (JP); Katsuhiko Obata, Fussa (JP); Mitsuaki Matsuo, Fussa (JP); Hirofumi Nagareda, Tachikawa (JP); Tadashi Kojima, Musashimurayama (JP); Oh Takahashi, Nishitokyo (JP); Toyokazu Nishio, Hamura (JP)

(73) Assignee: CASIO COMPUTER CO., LTD., Tokyo (JP)

(*) Notice: Subject to any disclaimer, the term of this patent is extended or adjusted under 35 U.S.C. 154(b) by 0 days.

(21) Appl. No.: 15/891,804

(22) Filed: Feb. 8, 2018

(65) Prior Publication Data

US 2018/0246473 A1 Aug. 30, 2018

(30) Foreign Application Priority Data

Feb. 27, 2017 (JP) ................................ 2017-034250

(51) Int. Cl.
*G01R 31/36* (2019.01)
*G04G 21/04* (2013.01)
(Continued)

(52) U.S. Cl.
CPC ............. *G04G 21/04* (2013.01); *G04C 10/02* (2013.01); *G04C 10/04* (2013.01); *G04G 5/002* (2013.01);
(Continued)

(58) Field of Classification Search
CPC ........ G04G 21/04; G04G 5/002; G04G 19/00; G08B 21/182; G04C 10/02; G04C 10/04; G04R 20/26
See application file for complete search history.

(56) References Cited

U.S. PATENT DOCUMENTS 9,488,695 B2 * 11/2016 Simeth ............... G01R 31/3835
2004/0135696 A1 * 7/2004 Hasegawa ............. H02J 7/0004
340/636.1
(Continued)

FOREIGN PATENT DOCUMENTS

JP S63-214280 A 9/1988
JP 2011-010418 A 1/2011
(Continued)

OTHER PUBLICATIONS

Notification of Reasons for Refusal dated Nov. 5, 2019 received in Japanese Patent Application No. JP 2017-034250 together with an English language translation.

*Primary Examiner* — Munear T Akki
(74) *Attorney, Agent, or Firm* — Scully, Scott, Murphy & Presser, P.C.

(57) ABSTRACT

A smartphone includes a receiver, a log acquirer, a determiner, an information notifier, and a display. The receiver is in wireless communication with a time display device. The log acquirer acquires log data from the time display device by the receiver. The determiner determines the usage status of the time display device on the basis of the log data acquired by the log acquirer. The information notifier provides, via the display, notification of information corresponding to the usage status determined by the determiner.

18 Claims, 24 Drawing Sheets

(51) Int. Cl.

| | |
|---|---|
| ***G04G 5/00*** | (2013.01) |
| ***G04G 19/00*** | (2006.01) |
| ***G08B 21/18*** | (2006.01) |
| ***G04C 10/02*** | (2006.01) |
| ***G04C 10/04*** | (2006.01) |
| *G04R 20/26* | (2013.01) |

(52) U.S. Cl.
CPC ........... *G04G 19/00* (2013.01); *G08B 21/182* (2013.01); *G04R 20/26* (2013.01)

(56) References Cited

U.S. PATENT DOCUMENTS

2004/0196004 A1* 10/2004 Sasaki .................. H02J 7/0065 320/127
2004/0214613 A1* 10/2004 Shin .................. H04W 52/0225 455/567
2004/0257042 A1* 12/2004 Liu .................... H01M 10/441 320/130
2012/0249323 A1* 10/2012 McRae .................. G08C 17/00 340/539.11
2014/0347057 A1* 11/2014 Oh ........................ G08C 17/02 324/426
2016/0254698 A1* 9/2016 Anderson ........... H01M 10/465 320/101

FOREIGN PATENT DOCUMENTS

JP 2015-135347 A 7/2015
JP 2015-142496 A 8/2015
JP 2015-195023 A 11/2015
JP 2017-166931 A 9/2017

* cited by examiner

FIG.3

LOG MEMORY

121

| KIND OF LOG DATA | TIME AND DATE OF LOG | LOG DATA | ··· |
|---|---|---|---|
| OUTPUT VOLTAGE OF BATTERY | 2017.02.15 10:10:10 | 5.0V | ··· |
| | 2017.02.15 10:00:10 | 4.8V | ··· |
| | ⋮ | ⋮ | ⋮ |
| | 2016.02.17 12:10:10 | 5.2V | ··· |
| | 2016.02.16 12:10:10 | 5.1V | ··· |
| CURRENT GENERATED FROM SOLAR CELL | 2017.02.15 10:10:15 | 220mA | ··· |
| | 2017.02.15 10:10:15 | 180mA | ··· |
| | ⋮ | ⋮ | ⋮ |
| | 2016.02.17 12:10:15 | 250mA | ··· |
| | 2016.02.16 12:10:15 | 230mA | ··· |
| AUTOMATIC CORRECTION OF HAND POSITION | 2017.02.10 18:10:20 | SECOND HAND: +15-DEGREE CORRECTION | ··· |
| | 2017.01.15 19:30:20 | HOUR HAND: +8-DEGREE CORRECTION | ··· |
| | 2016.11.11 12:20:20 | MINUTE HAND: −10-DEGREE CORRECTION | ··· |
| | ⋮ | ⋮ | ⋮ |
| TIME CORRECTION PROCESS | 2017.02.15 06:07:08 | GPS, SUCCEED | ··· |
| | ⋮ | ⋮ | ⋮ |
| | 2016.02.16 15:16:17 | STANDARD RADIO WAVE, FAIL | ··· |
| ⋮ | ⋮ | ⋮ | ⋮ |

FIG.5

LOG MEMORY

221

| KIND OF LOG DATA | TIME AND DATE OF LOG | LOG DATA | ··· |
|---|---|---|---|
| OUTPUT VOLTAGE OF BATTERY | 2017.02.15 10:10:10 | 5.0V | ··· |
| | 2017.02.15 10:00:10 | 4.8V | ··· |
| | ⋮ | ⋮ | ⋮ |
| | 2016.02.09 02:10:10 | 4.7V | ··· |
| | 2016.02.08 18:10:10 | 4.9V | ··· |
| CURRENT GENERATED FROM SOLAR CELL | 2017.02.15 10:10:15 | 220mA | ··· |
| | 2017.02.15 10:10:15 | 180mA | ··· |
| | ⋮ | ⋮ | ⋮ |
| | 2016.02.09 02:10:15 | 0mA | ··· |
| | 2016.02.08 18:10:15 | 150mA | ··· |
| AUTOMATIC CORRECTION OF HAND POSITION | 2017.02.10 18:10:20 | SECOND HAND: +15-DEGREE CORRECTION | ··· |
| | 2017.01.15 19:30:20 | HOUR HAND: +8-DEGREE CORRECTION | ··· |
| | 2016.11.11 12:20:20 | MINUTE HAND: -10-DEGREE CORRECTION | ··· |
| | ⋮ | ⋮ | ⋮ |
| TIME CORRECTION PROCESS | 2017.02.15 06:07:08 | GPS, SUCCEED | ··· |
| | ⋮ | ⋮ | ⋮ |
| | 2016.02.09 15:16:17 | GPS, STANDARD RADIO WAVE, FAIL | ··· |
| ⋮ | ⋮ | ⋮ | ⋮ |

FIG.7

TIMEPIECE-BASIS LOG MEMORY

321

| ELECTRONIC TIMEPIECE ID | KIND OF LOG DATA | TIME AND DATE OF LOG | LOG DATA | ··· |
|---|---|---|---|---|
| CC0135 | OUTPUT VOLTAGE OF BATTERY | 2017.02.15 10:10:10 | 5.0V | ··· |
| | | 2017.02.15 10:00:10 | 4.8V | ··· |
| | | ⋮ | ⋮ | ⋮ |
| | | 2016.02.17 12:10:10 | 5.2V | ··· |
| | | 2016.02.16 12:10:10 | 5.1V | ··· |
| | CURRENT GENERATED FROM SOLAR CELL | 2017.02.15 10:10:15 | 220mA | ··· |
| | | 2017.02.15 10:10:15 | 180mA | ··· |
| | | ⋮ | ⋮ | ⋮ |
| | | 2016.02.17 12:10:15 | 250mA | ··· |
| | | 2016.02.16 12:10:15 | 230mA | ··· |
| | AUTOMATIC CORRECTION OF HAND POSITION | 2017.02.10 18:10:20 | SECOND HAND: +15-DEGREE CORRECTION | ··· |
| | | 2017.01.15 19:30:20 | HOUR HAND: +8-DEGREE CORRECTION | ··· |
| | | 2016.11.11 12:20:20 | MINUTE HAND: −10-DEGREE CORRECTION | ··· |
| | | ⋮ | ⋮ | ⋮ |
| | TIME CORRECTION PROCESS | 2017.02.15 06:07:08 | GPS, SUCCEED | ··· |
| | | ⋮ | ⋮ | ⋮ |
| | | 2016.02.16 15:16:17 | STANDARD RADIO WAVE, FAIL OUTPUT VOLTAGE OF BATTERY | ··· |
| | ⋮ | ⋮ | ⋮ | ⋮ |
| CD5317 | OUTPUT VOLTAGE OF BATTERY | 2017.02.14 14:15:10 | 5.0V | ··· |
| | | ⋮ | ⋮ | ⋮ |
| | ⋮ | ⋮ | ⋮ | ⋮ |
| ⋮ | ⋮ | ⋮ | ⋮ | ⋮ |

INFORMATION NOTIFICATION METHOD, INFORMATION NOTIFICATION DEVICE, AND NON-TRANSITORY RECORDING MEDIUM

CROSS-REFERENCE TO RELATED APPLICATION

This application claims the benefit of Japanese Patent Application No. 2017-034250, filed on Feb. 27, 2017, the entire disclosure of which is incorporated by reference herein.

FIELD

This disclosure relates to an information notification method, an information notification device, and a non-transitory recording medium.

BACKGROUND

A battery-operated timepieces such as a wristwatch ceases to function as a timepiece when the voltage of a battery is reduced due to battery depletion. Therefore, such battery-operated timepieces often include the function of notifying a user of a reduction in the voltage of a battery.

For example, an electronic timepiece disclosed in Unexamined Japanese Patent Application Kokai Publication No. 2015-135347, which is a Japanese patent literature, is capable of changing a manner of rotating a second hand, thereby notifying a user of a reduction in the voltage of a battery. However, this notification enables the user to know only the reduction in the voltage of the battery at the time of the notification. Even if a previous usage status by the user is a cause of the voltage reduction, the user is incapable of knowing the cause.

SUMMARY

An information notification method, an information notification device, and a non-transitory recording medium are disclosed.

In order to achieve the above-described objectives, a preferred embodiment provides an information notification method performed by an information notification device including: a receiver in wireless communication with a time display device; and a display, the information notification method including:

a log acquisition step of acquiring log data of the time display device from the time display device by the receiver;

a determination step of determining a usage status of the time display device based on the log data acquired in the log acquisition step; and a notification step of providing, via the display, information corresponding to the usage status of the time display device, the usage status being determined in the determination step.

BRIEF DESCRIPTION OF THE DRAWINGS

A more complete understanding of this application can be obtained when the following detailed description is considered in conjunction with the following drawings, in which:

FIG. 3 is a view illustrating an example of log data stored in the log memory of the smartphone according to Embodiment 1;

FIG. 5 is a view illustrating an example of log data stored in the timepiece log memory of the electronic timepiece according to Embodiment 1;

FIG. 7 is a view illustrating an example of log data stored in the timepiece-basis log memory of the server according to Embodiment 1;

DETAILED DESCRIPTION

Figure 1:
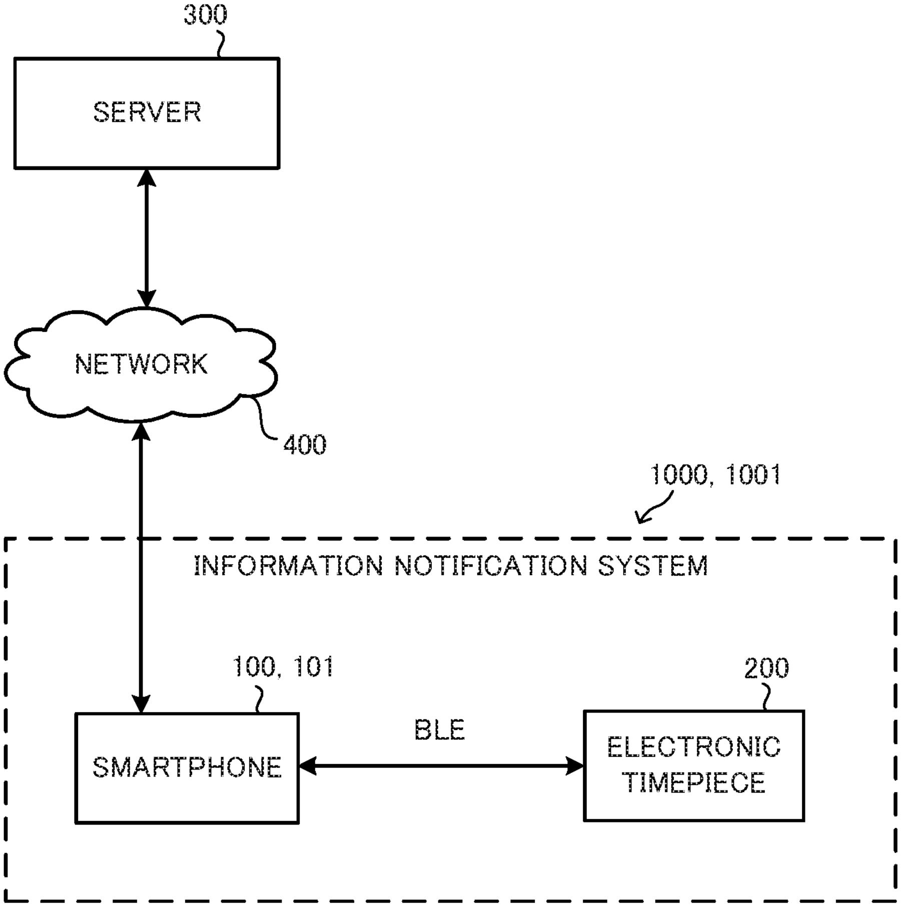
FIG. 1 is a view illustrating a configuration example of an information notification system according to Embodiment 1 of the present disclosure.

Embodiments will be described below with reference to the drawings. Components that are the same as or equivalent to each other in the drawings are denoted by the same reference characters.

Embodiment 1

The application of a smartphone 100 according to Embodiment 1 of the present disclosure to an information notification system 1000 illustrated in FIG. 1 will be described below as an example to facilitate interpretation. The information notification system 1000 includes the smartphone 100 and an electronic timepiece 200, as illustrated in FIG. 1. Short-range wireless communication between the smartphone 100 and the electronic timepiece 200 is carried out via Bluetooth (registered trademark) low energy (hereinafter referred to as "BLE"). BLE is a standard (mode) established for the purpose of reducing power consumption and a cost, in Bluetooth (registered trademark) which is a short-range wireless communication standard. The smartphone 100 can communicate with a server 300 via a network 400. An optional network such as the Internet or Long Term Evolution (LTE) (registered trademark) can be used as the network 400.

The smartphone 100 acquires, from the electronic timepiece 200, log data representing the various states and operation histories of the electronic timepiece 200, and determines the battery status, electricity generation status, and hand position correction status of the electronic timepiece 200 from the log data. The smartphone 100 notifies a user of necessary information on the basis of the various statuses determined from the log data. The smartphone 100 can upload the log data to the server 300 via the network 400. Therefore, the server 300 can collect log data from a large number of electronic timepieces 200 via plural smartphones 100.

Figure 2:
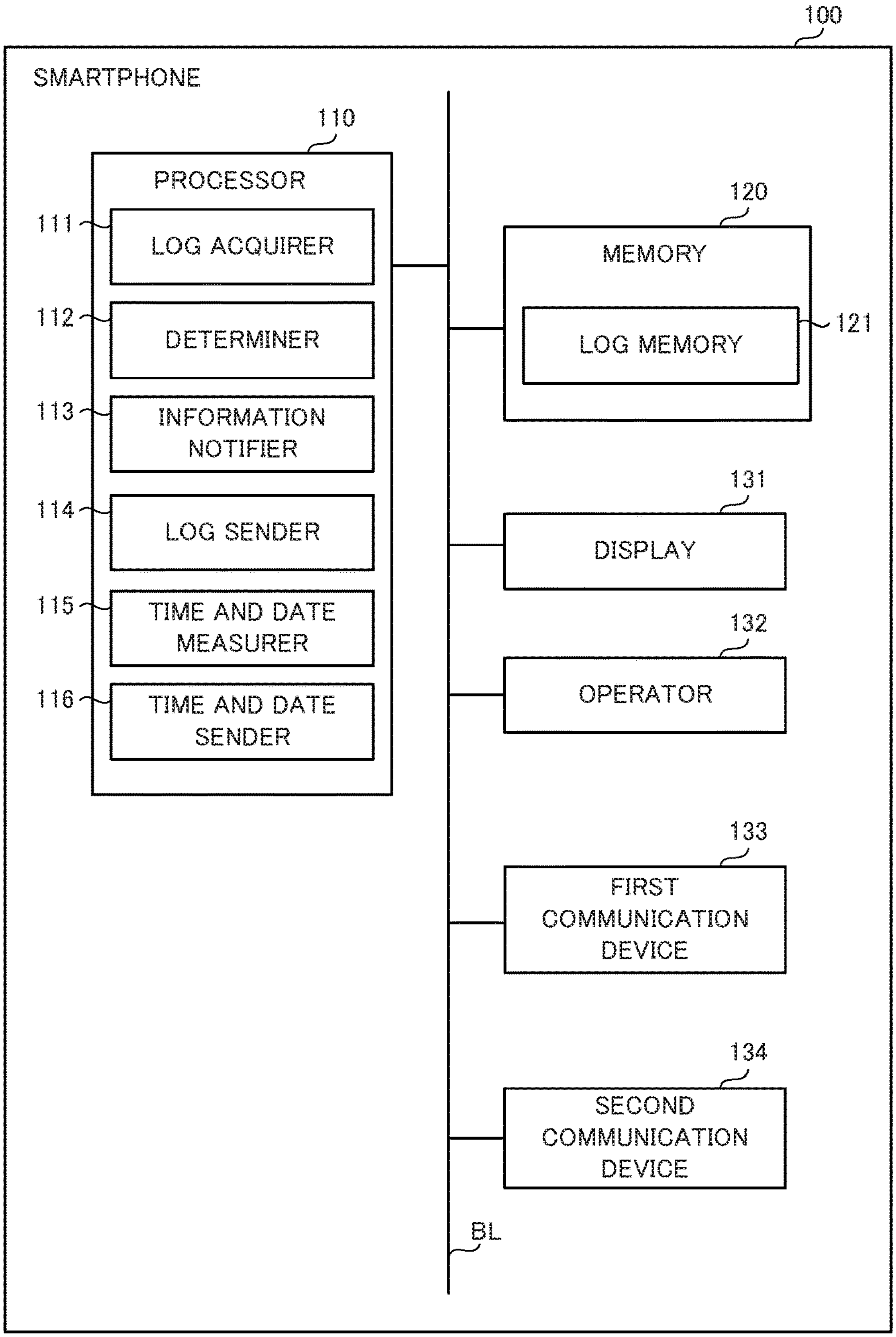
FIG. 2 is a block diagram illustrating the functional configuration of a smartphone according to Embodiment 1.

The functional configuration of the smartphone 100 according to the present embodiment will be described below. The smartphone 100 is an information notification device that provides notification of information about the electronic timepiece 200. As illustrated in FIG. 2, the smartphone 100 includes a processor 110, a memory 120, a display 131, an operator 132, a first communication device 133, and a second communication device 134, which are electrically connected to each other via a bus line BL.

The processor 110, including a processor such as a central processing unit (CPU), reads and executes a program stored in the memory 120, thereby controlling the operation of the smartphone 100.

The memory 120, including read-only memory (ROM) and random access memory (RAM), stores a program executed by the processor 110 as well as necessary data. The memory 120 functionally includes a log memory 121.

The log memory 121 stores log data acquired from the electronic timepiece 200, as illustrated in FIG. 3. In FIG. 3, "output voltage of battery", "current generated from solar cell", "automatic correction of hand position", and "time correction process" are listed as the kinds of the log data stored in the log memory 121. However, the kinds of the log data are illustrative. The log data of which the kind is "output voltage of battery" is log data in which the output voltages of the battery of the electronic timepiece 200 over the past year are stored. The most recent log data is stored every 10 minutes, the number of items of older log data is more reduced, and one-year old log data every one day is stored. One-year old or older log data is deleted from the log memory 121.

"Output voltage of battery" need not be a voltage value itself. For example, on the assumption that the output voltage of a battery on a full charge is defined as battery level 1, the value of a battery level is incremented by one in the case of a smaller voltage value, and the output voltage of a battery in a near empty state is defined as battery level 7, each value of the battery levels may be regarded as log data corresponding to "output voltage of battery."

The log data of which the kind is "current generated from solar cell" is log data in which a current output from a solar cell (solar battery) mounted in the electronic timepiece 200 over the past year is stored. Like the "output voltage of battery" described above, the most recent log data is stored every 10 minutes, the number of items of older log data is more reduced, and one-year old log data every one day is stored. One-year old or older log data is deleted from the log memory 121.

Like "output voltage of battery", "current generated from solar cell" need not be a current value itself. For example, on the assumption that a maximum output current in a solar cell is defined as generated current level 10, the value of a generated current level is decremented by one in the case of a smaller current value, and 0 mA is defined as generated current level 0, each value of the generated current levels may be regarded as log data corresponding to "current generated from solar cell."

The log data of which the kind is "automatic correction of hand position" is log data in which a time and date at which the function of automatically correcting a hand position, included in that electronic timepiece 200, has been executed, and the hand and amount corrected at the time and date are stored. When the number of times of the storage exceeds the number of times of storage of correction of a hand position (for example, 20 times), old log data is deleted from the log memory 121.

The log data of which the kind is "time correction process" is log data in which the content of the time correction process of the electronic timepiece 200 over the past year is stored. The time correction process may succeed (a correct time is acquired, and correct setting to the time is made) or may fail (a correct time is incapable of being acquired, and a time is incapable of being corrected). When one or more time correction processes succeed in a day, a time at which the first time correction process succeeds is stored. When none of time corrections carried out in a day fail, a time at which the final time correction fails is stored. The log data of a day in which no time correction process is carried out is not stored. One-year old or older log data is deleted from the log memory 121. Not only the success or failure of the time correction process but also means (the global positioning system (GPS), a standard radio wave, or connection to a smartphone through BLE) used for the time correction process is stored in the log data. When plural means are used, all the means used are stored.

The display 131, including a liquid crystal display (LCD), an electro-luminescence (EL) display, or the like, displays information of which notification is provided to a user.

The operator 132 is an input interface that includes a touch panel, an operation button, and the like and that accepts an operated input from a user.

The first communication device 133 is a BLE wireless module including an antenna for communication with the electronic timepiece 200. The first communication device 133 sends and receives information to and from the electronic timepiece 200 under control from the processor 110.

The second communication device 134 is a wireless module including an antenna for communication with the server 300. The second communication device 134, which is a wireless module for wireless communication based on, for example, LTE (registered trademark) or a wireless local area network (LAN), sends and receives information to and from the server 300 under control from the processor 110.

The functional constitution of the processor 110 of the smartphone 100 will now be described. The processor 110 executes a program stored in the memory 120, thereby operating as a log acquirer 111, a determiner 112, an information notifier 113, a log sender 114, a time and date measurer 115, and a time and date sender 116.

The log acquirer 111 acquires log data from the electronic timepiece 200 and allows the log data to be stored in the log memory 121. The log acquirer 111 acquires the log data from the electronic timepiece 200 when the smartphone 100 is connected to the electronic timepiece 200 via the first communication device 133 through BLE. Examples of this connection include two types: manual connection of the smartphone 100 to the electronic timepiece 200 by a user; and automatic connection of the electronic timepiece 200 to the smartphone 100 for automatic time correction.

The determiner 112 determines statuses such as the battery status, solar cell status, and hand position correction status of the electronic timepiece 200 on the basis of the log data stored in the log memory 121. A process in which the determiner 112 determines the statuses will be detailed later.

The information notifier 113 allows information of which notification should be provided to a user to be displayed on the display 131 on the basis of the statuses of the electronic timepiece 200, determined by the determiner 112.

The log sender 114 sends the log data stored in the log memory 121 to the server 300 via the second communication device 134.

The time and date measurer 115 measures a current date and time. The smartphone 100 includes any one or more functions of the function of communicating with an LTE (registered trademark) base station, the function of receiving GPS radio waves, and the function of receiving a standard radio wave. The functions are not illustrated. The smartphone 100 regularly acquires a current correct time and date on the basis of the functions. The time and date measurer 115 uses the correct time and date acquired on the basis of the functions, thereby measuring the current time and date with a small error.

The time and date sender 116 sends a date and time measured by the time and date measurer 115 to the electronic timepiece 200 via the first communication device 133 when the electronic timepiece 200 is connected to the smartphone 100 in order to correct a time.

The configuration of the smartphone 100 according to Embodiment 1 has been described above.

Figure 4:
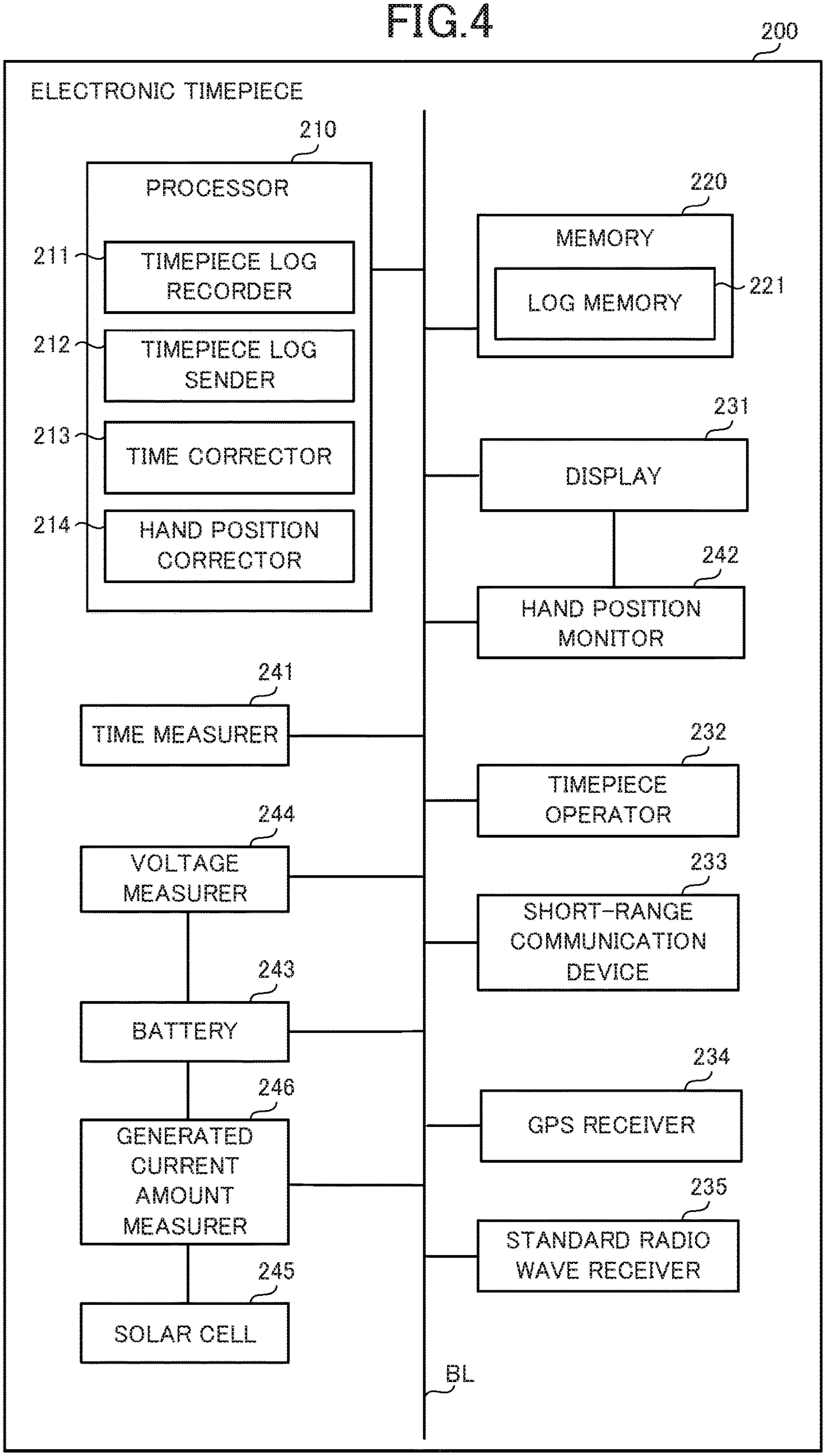
FIG. 4 is a block diagram illustrating the functional configuration of an electronic timepiece according to Embodiment 1.

The functional configuration of the electronic timepiece 200 according to Embodiment 1 will now be described. The electronic timepiece 200, which is a battery-operated wristwatch, can communicate with the smartphone 100 through BLE. However, the electronic timepiece 200 is not limited to a wristwatch, but may be any device that is a battery-operated device (time display device) having the function of displaying a time. As illustrated in FIG. 4, the electronic timepiece 200 includes a processor 210, a memory 220, a display 231, a timepiece operator 232, a short-range communication device 233, a GPS receiver 234, a standard radio wave receiver 235, a time measurer 241, a hand position monitor 242, a battery 243, a voltage measurer 244, a solar cell 245, and an electricity generation amount measurer 246, which are electrically connected to each other via a bus line BL.

The processor 210, including a processor such as a CPU, executes a program stored in the memory 220, thereby controlling the operation of the electronic timepiece 200.

The memory 220, including ROM and RAM, stores a program executed by the processor 210 as well as necessary data. The memory 220 functionally includes a log memory 221.

The log memory 221 stores the log data of the electronic timepiece 200 by a timepiece log recorder 211 described later, as illustrated in FIG. 5. Specific examples of the log data include an output voltage of the battery 243, a current generated from the solar cell 245, the presence or absence of a process of automatically correcting a hand position, and the presence or absence of a time correction process. In the log data, the log data of the output voltage of the battery 243 and the current generated from the solar cell 245 is stored as follows: the most recent log data is stored every 10 minutes, and one-day old or older log data, of which the number of items is reduced to the number of items of log data every 8 hours, is stored. The number of the items of the log data is reduced so that log data with the maximum value recorded in eight hours remains.

One-week old or older log data is deleted from the log memory 221. The log data need not be a voltage or current value itself, as described in the log memory 121 above. For example, the value of battery level and the value of generated current level may be used as log data instead of a voltage value and a current value, respectively.

The log data of the presence or absence of the process of automatically correcting a hand position is log data in which a time and date at which a hand position correction process has been carried out by a hand position corrector 214 described later as well as the hands and amounts corrected at the times and dates of which the number is equal to the number (for example, five) of stored corrections of hand positions are stored. When the number of the times and dates exceeds the number of the stored corrections of the hand positions, old log data is deleted from the log memory 221.

The log data of the time correction process is log data in which the content of the time correction process of the electronic timepiece 200 over the past week is stored. The time correction process may succeed (a correct time is acquired, and correct setting to the time is made) or may fail (a correct time is incapable of being acquired, and a time is incapable of being corrected). When one or more time correction processes succeed in a day, a time at which the first time correction process succeeds is stored. When none of time corrections carried out in a day fail, a time at which the final time correction fails is stored. The log data of a day in which no time correction process is carried out is not stored. One-week old or older log data is deleted from the log memory 221. Not only the success or failure but also means (GPS, a standard radio wave, or connection to a smartphone through BLE) used for the time correction process is stored in the log data. When plural means are used, all the means used are stored.

The display 231, including a motor driver, a motor, a wheelwork mechanism, hands (second hand, minute hand, and hour hand), a day vehicle, as well as a display driver and a display (LCD or organic EL display), displays a current time and a date.

The timepiece operator 232 includes a winding crown, a push button switch, and the like. A user operates the winding crown, the push button switch, and the like, thereby allowing the electronic timepiece 200 to perform time correction, connection to the smartphone 100, and the like.

The short-range communication device 233 is a BLE wireless module including an antenna for communication with the smartphone 100. The short-range communication device 233 sends and receives information to and from the smartphone 100 under control from the processor 210. The electronic timepiece 200 can send log data to the smartphone 100 via the short-range communication device 233 and can receive information about a time and date measured by the smartphone 100 to perform time correction.

The GPS receiver 234 receives a radio wave sent from a GPS satellite. The GPS receiver 234 receives the radio wave, thereby enabling the electronic timepiece 200 to acquire information about a current location and a time.

The standard radio wave receiver 235 receives a standard radio wave. The standard radio wave receiver 235 receives the standard radio wave, thereby enabling the electronic timepiece 200 to acquire a current time.

The time measurer 241, including a time measurement circuit, measures a current time and date and outputs the measurement result to the processor 210. The processor 210 carries out a time measurement process of updating information about a current time stored in the memory 220 on the basis of the time measurement result input from the time measurer 241 and allows a current time to be displayed on the display 231. The function of the time measurer 241 may be implemented by the processor 210.

The hand position monitor 242 monitors whether or not there is a difference between a time indicated by each hand (second hand, minute hand, and hour hand) included in the display 231 and a current time measured by the time measurer 241. If the difference is monitored, the hand position monitor 242 notifies the hand position corrector 214 described later of the difference. The monitoring need not be continuously always performed, but may be regularly performed. For example, the respective differences between the hour, minute, and second indicated by the hands included in the display 231 and the hour, minute, and second of the current time are monitored at such regular intervals that the second hand is monitored once a minute, the minute hand is monitored once an hour, and the hour hand is monitored once a day.

The battery 243 is a rechargeable secondary battery that supplies electric power to the electronic timepiece 200.

The voltage measurer 244 measures an output voltage of the battery 243. The voltage value measured by the voltage measurer 244 is output to the timepiece log recorder 211 described later.

The solar cell 245 is a solar battery that supplies electric power for charging the battery 243 when receiving light irradiation.

The electricity generation amount measurer 246 measures the amount of electricity (generated current) generated by the solar cell 245. The current generated by the solar cell 245 is used for charging the battery 243. Therefore, the amount of electricity is the same as the value of current with which the battery 243 is charged. The current value measured by the electricity generation amount measurer 246 is output to the timepiece log recorder 211 described later.

The functional configuration of the processor 210 of the electronic timepiece 200 will now be described. The processor 210 functionally includes the timepiece log recorder 211, a timepiece log sender 212, a time corrector 213, and the hand position corrector 214.

The timepiece log recorder 211 allows the value of the output voltage of the battery 243, measured by the voltage measurer 244, the value of the current generated from the solar cell 245, measured by the electricity generation amount measurer 246, the result of time correction performed by the time corrector 213, the result of hand position correction performed by the hand position corrector 214, and the like to be stored in the log memory 221.

The timepiece log sender 212 sends log data stored in the log memory 221 to the smartphone 100 via the short-range communication device 233.

The time corrector 213 carries out a manual time correction process in response to directions from the timepiece operator 232 by a user and an automatic time correction process which is carried out regularly (for example, by starting the time correction process at a predetermined time every day). Such a time correction process is carried out by acquiring a current correct time and date through reception of a GPS radio wave, reception of a standard radio wave, or connection to the smartphone 100, regardless of whether the time correction process is manual or automatic.

The hand position corrector 214 corrects a hand position to an accurate position indicating a current time when receiving notification of the wrong hand position from the hand position monitor 242.

The configuration of the electronic timepiece 200 according to Embodiment 1 has been described above.

Figure 6:
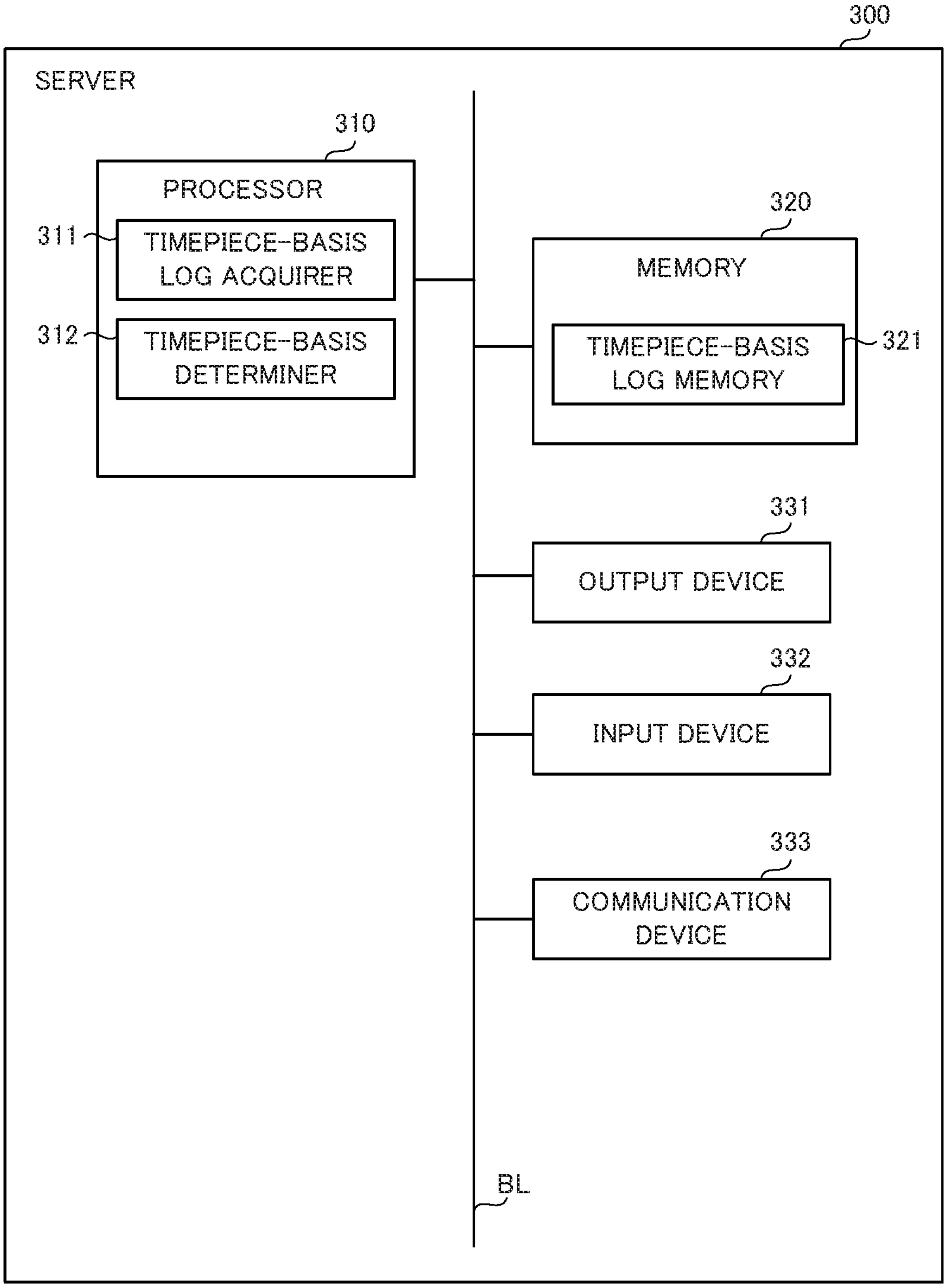
FIG. 6 is a block diagram illustrating the functional configuration of a server according to Embodiment 1.

The functional configuration of the server 300 according to Embodiment 1 will now be described. The server 300 is a computer that is connected to the smartphone 100 via the network 400 and that can receive and store log data from the smartphone 100. As illustrated in FIG. 6, the server 300 includes a processor 310, a memory 320, an output device 331, an input device 332, and a communication device 333, which are electrically connected via a bus line BL.

The processor 310, including a processor such as a CPU, executes a program stored in the memory 320, thereby controlling the operation of the server 300.

The memory 320, including ROM and RAM, stores a program executed by the processor 310 as well as necessary data. The memory 320 functionally includes a log memory 321.

The log memory 321 stores the log data of the electronic timepiece 200, acquired by a timepiece-basis log acquirer 311 described later. The server 300 can communicate with plural smartphones 100 and can therefore receive log data of plural electronic timepieces 200. Therefore, the log memory 321 stores log data according to the identifier (ID) of each electronic timepiece 200, as illustrated in FIG. 7. The content of the log data in the log memory 321 is similar to that in the log memory 121 of the smartphone 100 except that the log data is stored according to the ID of each electronic timepiece 200. However, since the storage capacity of the memory 320 of the server 300 is typically larger than the storage capacity of the memory 120 of the smartphone 100, the log data may be stored for a storage period that is longer than a storage period in the log memory 121. For example, "output voltage of battery" and "current generated from solar cell" may be stored over the past several years.

The output device 331 is an output device such as an LCD or an EL display. The input device 332 is an input device such as a keyboard, a mouse, or a touch panel. The communication device 333 is a communication device for communicating with the smartphone 100. An optional communication device may be used as the communication device 333 as long as being able to communicate with the smartphone 100.

The functional configuration of the processor 310 of the server 300 will now be described. The processor 310 executes the program stored in the memory 320, thereby operating as the timepiece-basis log acquirer 311 and a timepiece-basis determiner 312.

The timepiece-basis log acquirer 311 acquires the ID and log data of the electronic timepiece 200 from the smartphone 100 and allows the ID and the log data to be stored in the log memory 321.

According to each electronic timepiece 200, the timepiece-basis determiner 312 determines statuses such as the battery status, solar cell status, and hand position correction status of the electronic timepiece 200 on the basis of the log data stored in the log memory 321. A process in which the timepiece-basis determiner 312 determines the statuses is similar to the process carried out by the determiner 112 of the smartphone 100, and therefore, a description of the details thereof will be omitted.

The configuration of the server 300 according to Embodiment 1 has been described above. A process in which the smartphone 100 determines the status of the electronic timepiece 200 and optionally notifies a user of information will now be described in turn.

(Initialization Process)

Figure 8:
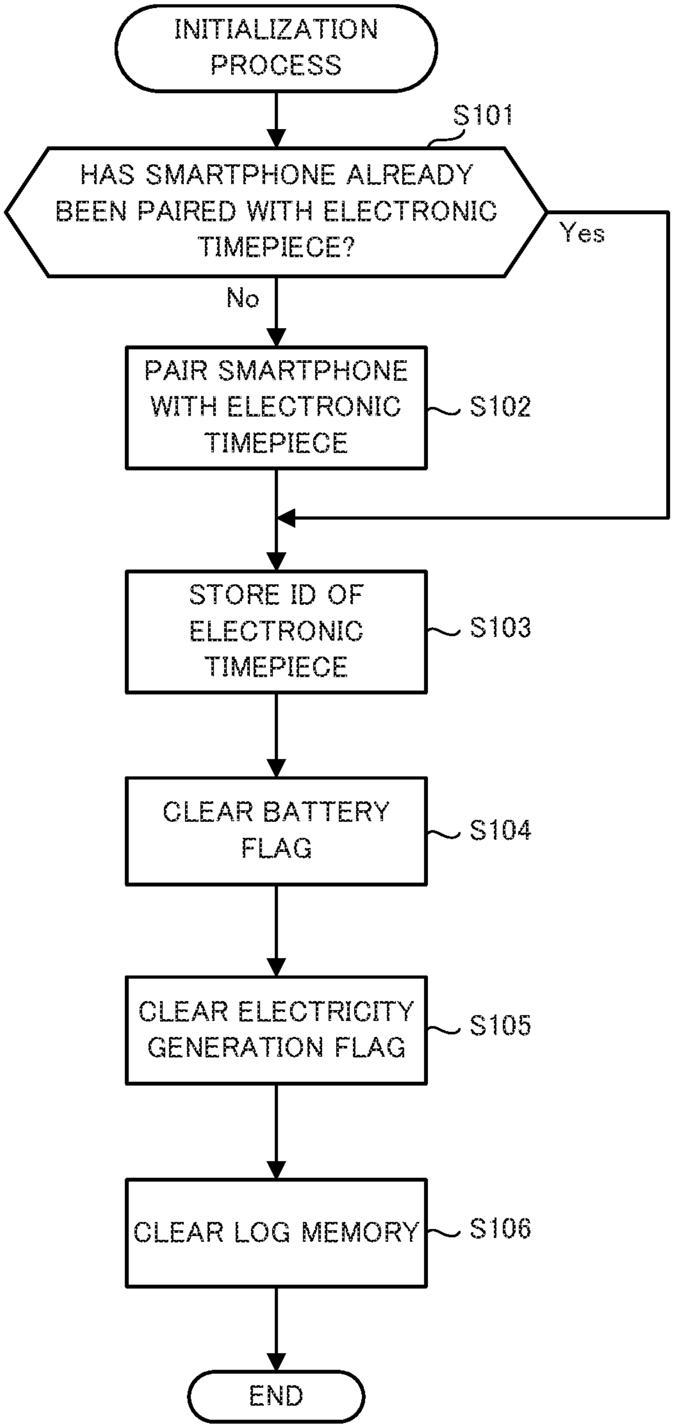
FIG. 8 is a flowchart of an initialization process according to Embodiment 1.

An initialization process for connecting the smartphone 100 and the electronic timepiece 200 to each other through BLE and allowing the smartphone 100 to grasp the status of the electronic timepiece 200 will now be described with reference to FIG. 8. This process is carried out only once as an operation of registering the electronic timepiece 200 in the smartphone 100 when a user purchases the electronic timepiece 200. The initialization process is provided as, for example, application software for a smartphone. The user starts the application software, thereby starting the initialization process.

First, the processor 110 determines whether or not the smartphone 100 has already been paired with the electronic timepiece 200 (step S101). "Pairing" means connection of instruments communicating with each other through Bluetooth (registered trademark) to each other. If the smartphone 100 was paired with the electronic timepiece 200 in the past, automatic connection can be made based on information at the time of the past pairing. Therefore, the processor 110 can determine whether or not the smartphone 100 has already been paired with the electronic timepiece 200 on the basis of the information. If the smartphone 100 has already been paired with the electronic timepiece 200 (Yes in step S101), the process proceeds to step S103.

If the smartphone 100 has not been paired with the electronic timepiece 200 (No in step S101), the processor 110 pairs the smartphone 100 with the electronic timepiece 200 (step S102).

After the completion of the pairing, the processor 110 acquires the ID of the electronic timepiece 200 and allows the ID to be stored in the memory 120 (step S103).

Then, the processor 110 clears, to "0", "battery flag" which is a variable stored in the memory 120 (step S104). In addition, the processor 110 also clears, to "0", "electricity generation flag" which is a variable stored in the memory 120 (step S105). Further, the processor 110 clears the entire log memory 121 to "0" (step S106) and ends the initialization process. The variable "battery flag" is a flag representing whether or not there is a possibility that the battery of the electronic timepiece 200 degrades. The variable "battery flag" is cleared to "0" if the determiner 112 determines that there is no possibility that the battery of the electronic timepiece 200 degrades, while the variable "battery flag" is set to "1" if the determiner 112 determines that there is a possibility that the battery of the electronic timepiece 200 degrades. The variable "electricity generation flag" is a flag representing whether or not there is a possibility that the solar cell of the electronic timepiece 200 degrades. The variable "electricity generation flag" is cleared to "0" if the determiner 112 determines there is no possibility that the solar cell of the electronic timepiece 200 degrades, while the variable "electricity generation flag" is set to "1" if the determiner 112 determines there is a possibility that the solar cell of the electronic timepiece 200 degrades. The variable "battery flag" is cleared to "0" in step S104 described above. However, the variable "battery flag" may be set to "1" in step S104. The previous setting of the variable "battery flag" to "1" helps the smartphone 100 to provide notification of information about charging described later. Similarly, the variable "electricity generation flag" may also be set to "1" in step S105.

The above initialization process allows the smartphone 100 to be in preparation for determining the various statuses of the electronic timepiece 200 on the basis of a future trend in use of the electronic timepiece 200.

(Log Acquisition Process)

Figure 9:
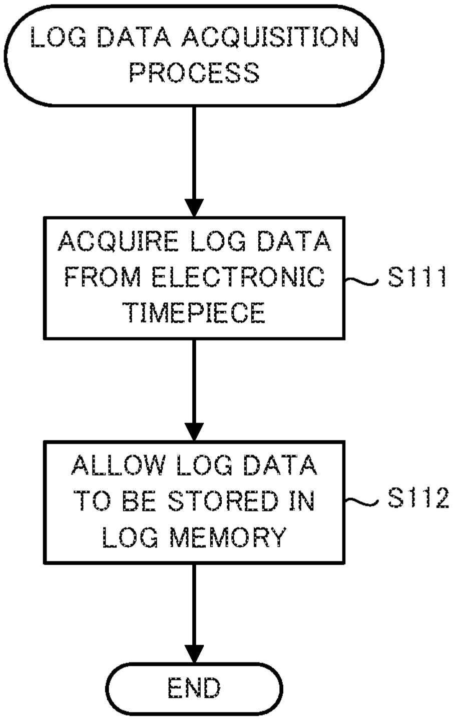
FIG. 9 is a flowchart of a log data acquisition process according to Embodiment 1.

The above-described initialization process allows the smartphone 100 to be merely in preparation for determining the various statuses of the electronic timepiece 200. The acquisition of log data from the electronic timepiece 200 by the smartphone 100 is required for performing the determination. Thus, such a log data acquisition process will now be described with reference to FIG. 9. The execution of the log data acquisition process is started by the connection of the electronic timepiece 200 to the smartphone 100. For example, when a user connects the electronic timepiece 200 to the smartphone 100 in order to correct the time of the electronic timepiece 200, not only the time correction process but also the log data acquisition process is carried out. In such a case, the smartphone 100 may simultaneously execute the time correction process and the log data acquisition process in different threads or may execute one process in advance and then execute the other process.

First, the log acquirer 111 of the smartphone 100 acquires log data from the electronic timepiece 200 via the first communication device 133 (step S111). Step S111 is also referred to as a log acquisition step. When the smartphone 100 executes step S111, the timepiece log sender 212 of the electronic timepiece 200 sends log data stored in the log memory 221 to the smartphone 100 via the short-range communication device 233.

Then, the log acquirer 111 of the smartphone 100 allows the acquired log data to be stored in the log memory 121 (step S112) and ends the log data acquisition process. In step S112, the log acquirer 111 deletes old log data (for example, one-year old or older "output voltage of battery") stored in the log memory 121 as well as log data of which the number of items should be reduced. For example, log data of seven-day old to one-day old "output voltage of battery" every 8 hours is sent from the electronic timepiece 200. The number of the items of the log data is reduced to achieve log data every one day. The log acquirer 111 reduces the number of items of log data of "output voltage of battery" and "current generated from solar cell" so that log data in which the maximum values in a day are recorded remains.

The above log data acquisition process allows log data acquired from the electronic timepiece 200 to be accumulated in the log memory 121 and enables the smartphone 100 to determine the various statuses of the electronic timepiece 200.

(Information Notification Process)

An information notification process in which the smartphone 100 determines the various statuses of the electronic timepiece 200 to notify a user of necessary information will be described with reference to FIG. 10.

The execution of the information notification process is started when the log data acquisition process described above is ended. The execution is also started when a user starts application software for starting the information notification process.

When the information notification process is started, the smartphone 100 in turn carries out a battery status determination process (step S201), an electricity generation status determination process (step S202), and a hand position status determination process (step S203) and then ends the information notification process. In each determination process, the smartphone 100 notifies a user of information when the need for notifying the user of the information is determined. Thus, the processes will be detailed in turn.

To facilitate interpretation, log data of "output voltage of battery" is evaluated in the form of battery levels 1 to 7, and log data of "current generated from solar cell" is evaluated in the form of electricity generation levels 10 to 0, in a description of each of the following processes. Battery level 1 is assumed to correspond to the output voltage of the battery 243 on a full charge, and battery level 7 is assumed to correspond to the output voltage of the battery 243 in a near empty state. Electricity generation level 10 is assumed to correspond to a current generated when the solar cell 245 is irradiated with sunlight outdoors on a clear day, and electricity generation level 0 is assumed to correspond to a current generated when the solar cell 245 is irradiated with no light. Electricity generation level 5 is assumed to correspond to a generated current that is almost equivalent to a current consumed when the electronic timepiece 200 normally operates, and electricity generation level 7 is assumed to correspond to a generated current in an environment just under a fluorescent lamp. In the following description, a minimum voltage as battery level 5 is assumed to be a voltage reference value, a minimum current as electricity generation level 5 is assumed to be an equilibrium electricity generation reference value, and a minimum current as electricity generation level 7 is assumed to be a normal electricity generation reference value. However, the level values and the reference values are illustrative. Therefore, the level values and the reference may be changed to more suitable values as appropriate.

To facilitate interpretation, a description of each of the following processes is provided on the assumption that a period for which a status is determined is "one month." However, the period (status determination reference period) is not limited to one month.

The battery status determination process executed in step S201 in FIG. 10 will now be described with reference to FIG. 11.

In the battery status determination process, the determiner 112 of the smartphone 100 first refers to the log memory 121 and determines whether or not the value of the latest (most recent) log data of "output voltage of battery" is less than the voltage reference value (step S301). Step S301 is also referred to as a determination step. Herein, a value of log data of "output voltage of battery" of less than the voltage reference value means that a battery level recorded as the log data is 6 or 7.

If the value of the latest log data of "output voltage of battery" is equal to or more than the voltage reference value (No in step S301), the processor 110 clears a variable "battery flag" to "0" (step S302) and ends the battery status determination process. If the value of the latest log data of "output voltage of battery" is less than the voltage reference value (Yes in step S301), the determiner 112 determines whether or not the value of the variable "battery flag" is "1" (step S303).

If the value of the variable "battery flag" is not "1" (No in step S303), the determiner 112 refers to the log memory 121 and determines whether or not the peak value of the log data of "output voltage of battery" over the past one month is less than the voltage reference value (step S304). Step S304 is also referred to as a determination step.

Figure 12:
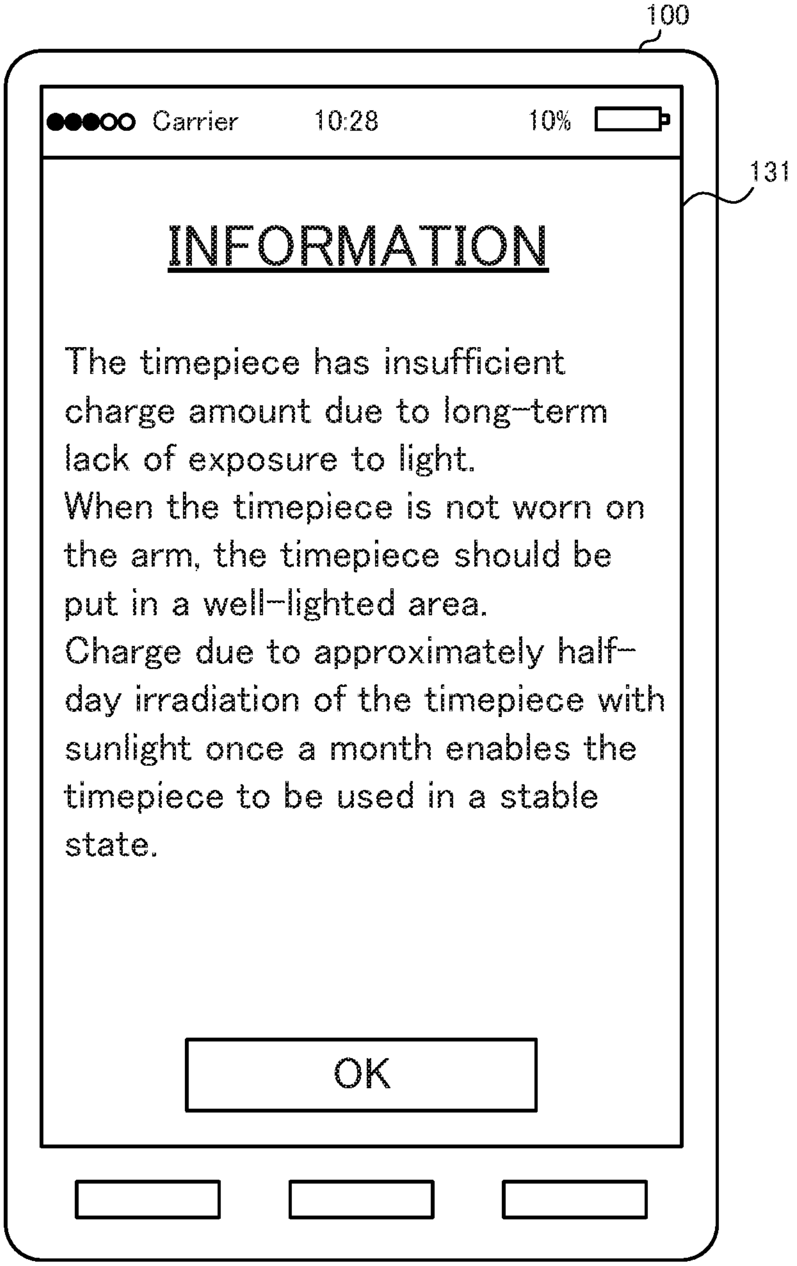
FIG. 12 is a view illustrating an example of a display of charge guidance according to Embodiment 1.

If the peak value of the log data of "output voltage of battery" over the past one month is less than the voltage reference value (Yes in step S304), the information notifier 113 displays charge guidance on the display 131 (step S305). Step S305 is also referred to as a notification step. The charge guidance is a screen for providing notification of the insufficiency of the amount of charge and advice for favorable charge (first notification), as illustrated in FIG. 12. The processor 110 sets the variable "battery flag" to "1", sets a variable "battery determination date" to a current date (date on which the electronic timepiece 200 is connected to the smartphone 100) (step S306), and ends the battery status determination process.

Figure 13:
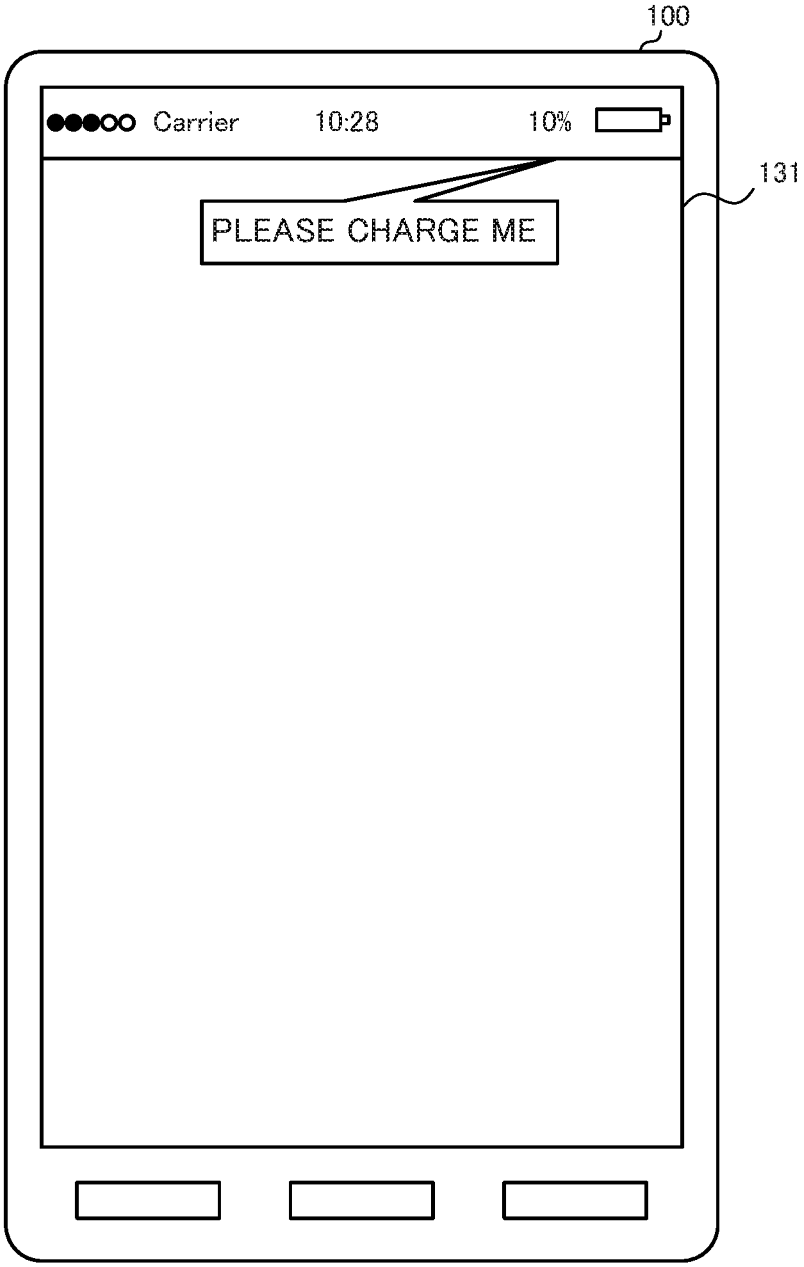
FIG. 13 is a view illustrating an example of a display of a notification center according to Embodiment 1.

If, in step S304, the peak value of the log data of "output voltage of battery" over the past one month is equal to or more than the voltage reference value (No in step S304), the information notifier 113 displays a notification center according to the value of the latest log data of "output voltage of battery" (step S307) and ends the battery status determination process. The display of a notification center is a display of a message in the upper portion of the screen of the smartphone 100, as illustrated in FIG. 13. FIG. 13 illustrates an example of a display of "PLEASE CHARGE ME" which is a message corresponding to battery level 7. The text of a message in a display of a notification center is "PLEASE CHARGE ME SOON" when the value of the latest log data of "output voltage of battery" is battery level 6.

If, in step S303, the value of the variable "battery flag" is "1" (Yes in step S303), the determiner 112 determines whether or not a lapse between the date set to the variable "battery determination date" and a current date is one or more months (step S308). Step S308 is also referred to as a determination step. If the lapse is not one or more months (No in step S308), the information notifier 113 displays a notification center according to the value of the latest log data of "output voltage of battery" (step S307), and the processor 110 ends the battery status determination process.

If the lapse between the date set to the variable "battery determination date" and the current date is one or more months (Yes in step S308), the determiner 112 refers to the log memory 121 and determines whether or not the peak value of the log data of "output voltage of battery" over the past one month is less than the voltage reference value (step S309). The step S309 is also referred to as a determination step. If the peak value of the log data over the past one month is equal to or more than the voltage reference value (No in step S309), the processor 110 clears the variable "battery flag" to "0" (step S310), and the information notifier 113 displays a notification center according to the value of the latest log data of "output voltage of battery" (step S307) and ends the battery status determination process.

If the peak value of the log data over the past one month is less than the voltage reference value (Yes in step S309), the determiner 112 refers to the log memory 121 and determines whether or not the peak value of the log data of "current generated from solar cell" over the past one month is equal to or more than the equilibrium electricity generation reference value (step S311). Step S311 is also referred to as a determination step. Herein, a value of the log data of "current generated from solar cell" of not less than the equilibrium electricity generation reference value means that an electricity generation level stored as log data is 5 or more. In other words, a peak value of the log data of "current generated from solar cell" over the past one month of less than the equilibrium electricity generation reference value means that the solar cell is incapable of generating an electric power equivalent to the usual consumed power of the electronic timepiece 200.

If the peak value of the log data of "current generated from solar cell" over the past one month is less than the equilibrium electricity generation reference value (No in step S311), the information notifier 113 displays charge guidance on the display 131 (step S313). Step S313 is also referred to as a notification step. The processor 110 sets the variable "battery determination date" to a current date (date on which the electronic timepiece 200 is connected to the smartphone 100) (step S314) and ends the battery status determination process.

If, in step S311, the peak value of the log data of "current generated from solar cell" over the past one month is equal to or more than the equilibrium electricity generation reference value (Yes in step S311), the determiner 112 refers to the log memory 121 and determines whether or not the average number of times of the reception of GPS and standard radio waves and communication with the smartphone 100 through BLE, used in the time correction process over the past one month, is equal to or more than a usage reference value (step S312). Step S312 is also referred to as a determination step. Herein, an average number of times of the reception of GPS and standard radio waves and communication with the smartphone 100 through BLE, of not less than the usage reference value, means that the average number of times of the reception of GPS and the standard radio waves and the communication with the smartphone 100 through BLE over the past one month is one or more times every two days.

If the average number of times of the reception of GPS and standard radio waves and the communication with the smartphone 100 through BLE, used in the time correction process over the past one month, is equal to or more than the usage reference value (Yes in step S312), the information notifier 113 displays charge guidance on the display 131 (step S313). The processor 110 sets the variable "battery determination date" to a current date (date on which the electronic timepiece 200 is connected to the smartphone 100) (step S314) and ends the battery status determination process.

Figure 14:
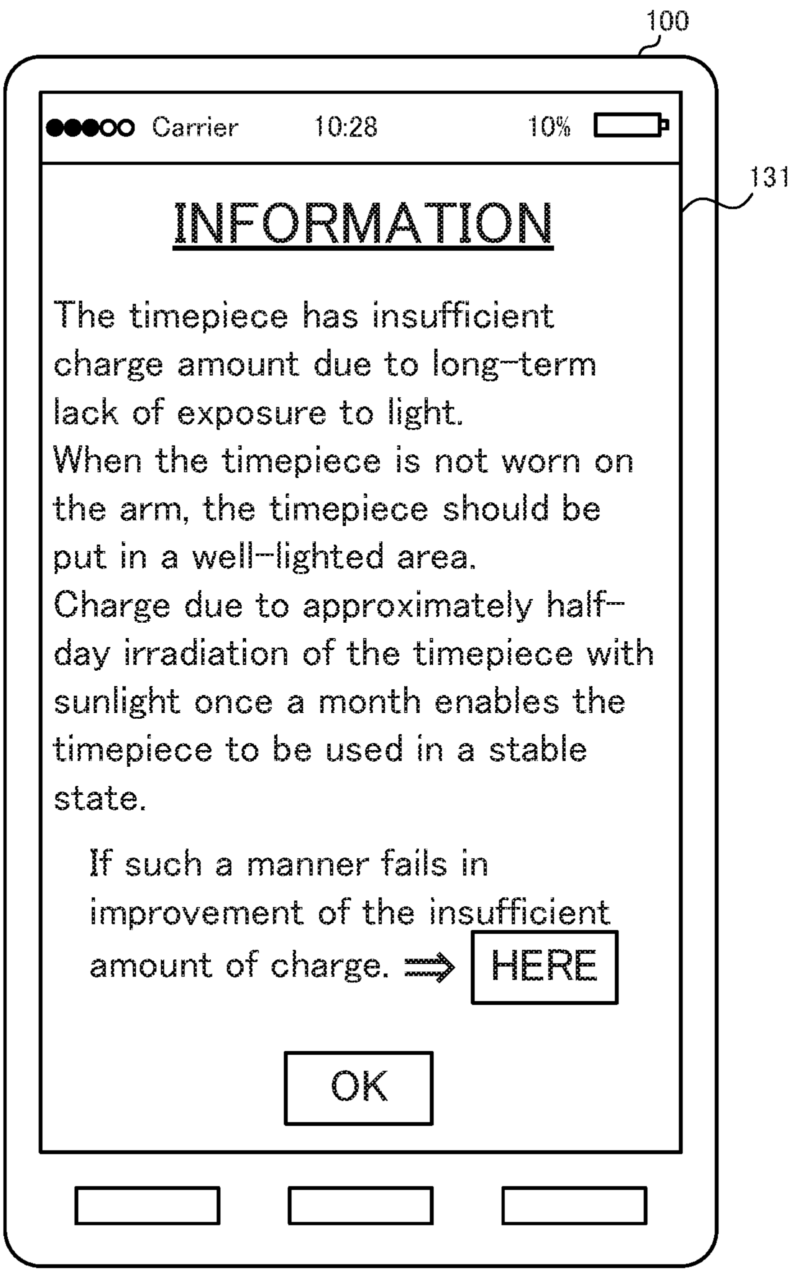
FIG. 14 is a view illustrating an example of a display of charge guidance for a need for confirmation of improvement according to Embodiment 1.

If the average number of times of the reception of GPS and standard radio waves and the communication with the smartphone 100 through BLE, used in the time correction process over the past one month, is less than the usage reference value (No in step S312), the information notifier 113 displays charge guidance on the need for confirming improvement on the display 131 (step S315) and waits for an input about the presence or absence of the improvement from a user (touch of "HERE" or "OK"). Step S315 is also referred to as a notification step. The input can be acquired through a touch panel included in the operator 132. The charge guidance for confirming improvement is a screen for providing notification of advice for favorable charge and for confirming whether or not the insufficient amount of charge has been improved, as illustrated in FIG. 14.

The processor 110 determines whether or not the input from the user is "not improved" (touch of "HERE") (step S316). If the input from the user is not "not improved" (that is, "OK") (No in step S316), the processor 110 ends the battery status determination process.

Figure 15:
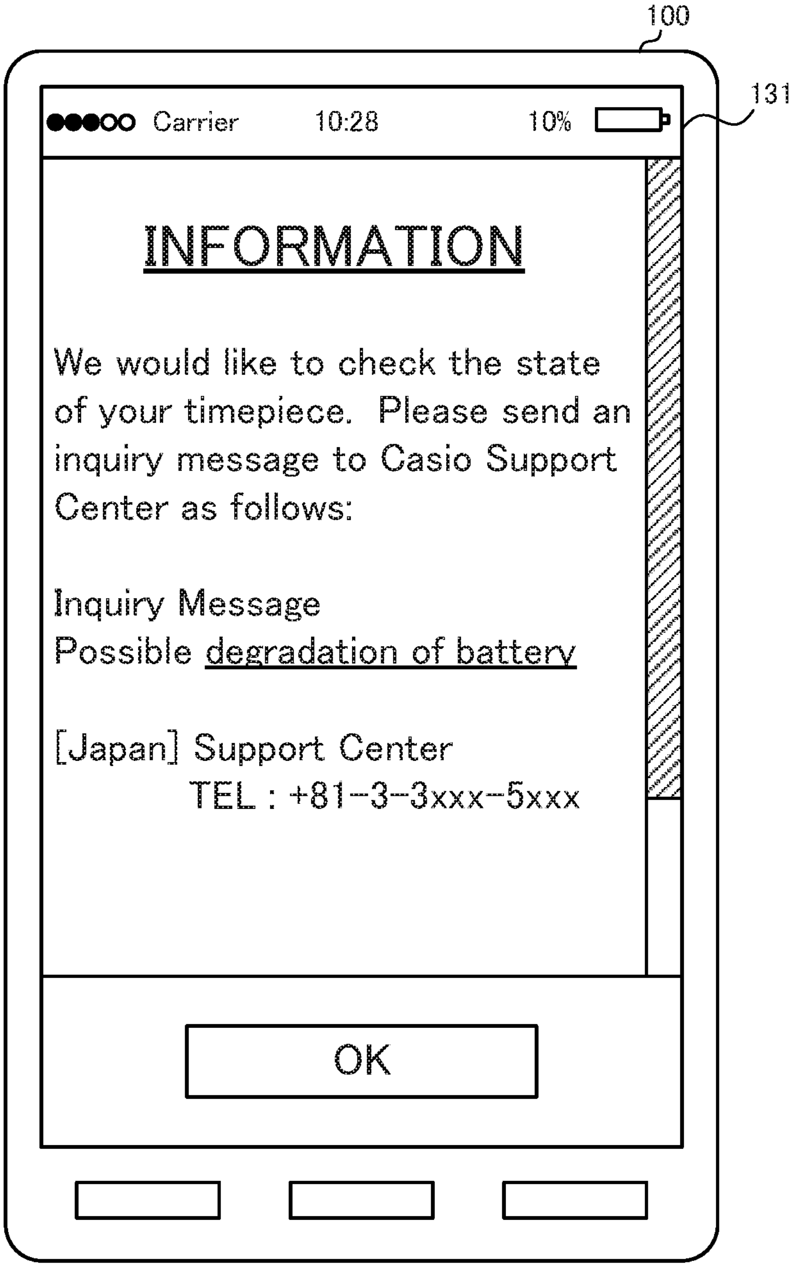
FIG. 15 is a view illustrating an example of a display of a support center in the battery status determination process according to Embodiment 1.

If the input from the user is "not improved" (that is, "HERE") (Yes in step S316), the processor 110 clears the variable "battery flag" to "0" (step S317), and the information notifier 113 displays a support center indicating the possibility of the degradation of the battery, as illustrated in FIG. 15, (second notification) on the display 131 (step S318) and ends the battery status determination process.

The battery status determination process has been described above. In the battery status determination process, the smartphone 100 can provide notification of advice information for favorable charge when the amount of charge of the electronic timepiece 200 is insufficient for a long period. If the amount of charge of the electronic timepiece 200 is still insufficient for a long period after the notification of the advice information, the smartphone 100 outputs a message for confirming whether or not the insufficient amount of charge has been improved. The smartphone 100 can provide notification of the possibility of the degradation of the battery if acquiring an answer that the insufficient amount of charge has not been improved.

Figure 16:
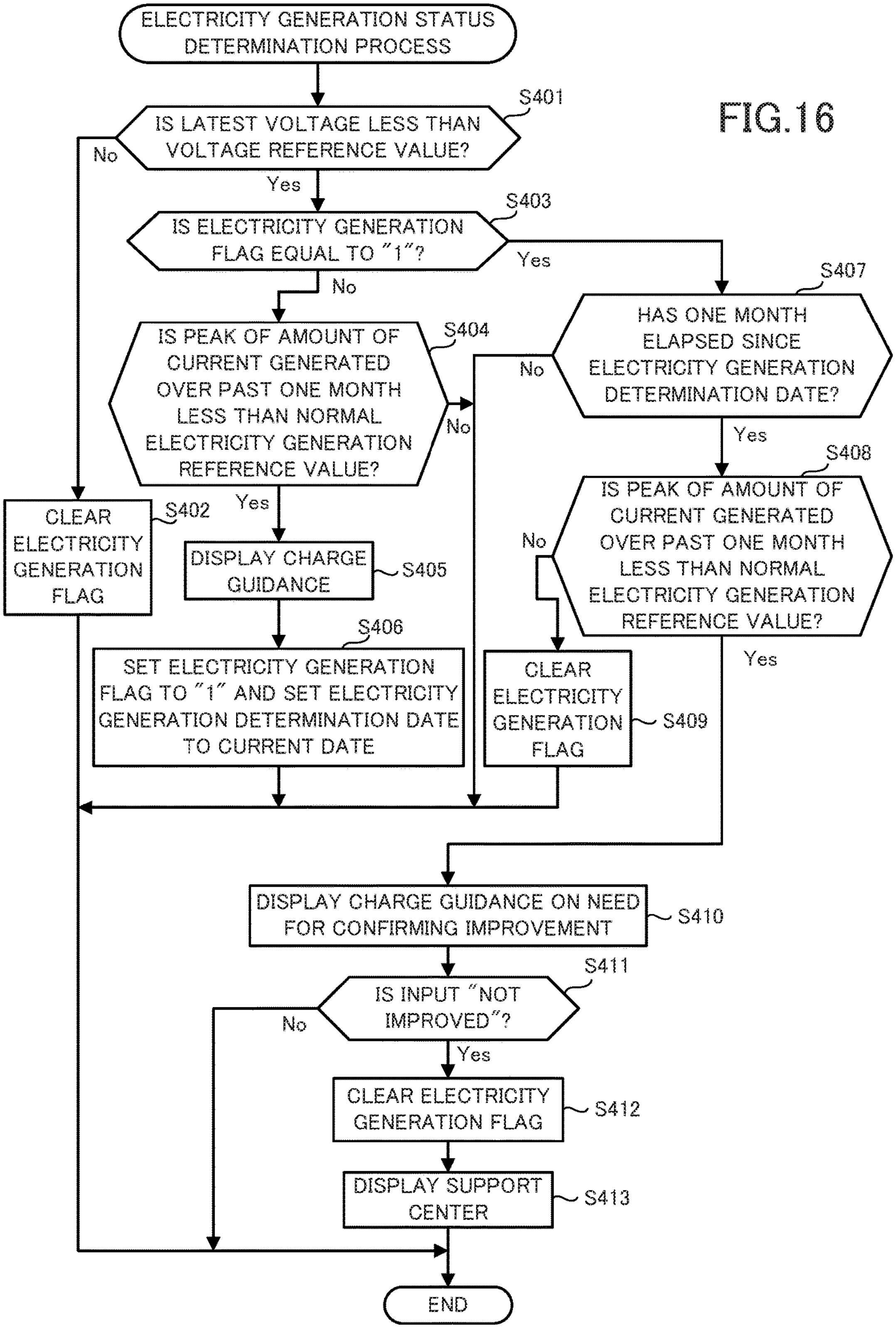
FIG. 16 is a flowchart of an electricity generation status determination process according to Embodiment 1.

In a case in which the smartphone 100 fails to acquire the log data of the electronic timepiece 200 for not less than one month (status determination reference period) (in a case in which the previous log acquisition date is not less than one month (status determination reference period) before), the status of the battery of the electronic timepiece 200 is more likely to be incapable of being accurately determined. In this case, therefore, the overall battery status determination process may be skipped (battery status determination process may be ended without any processing). The electricity generation status determination process executed in step S202 of FIG. 10 will now be described with reference to FIG. 16.

In the electricity generation status determination process, first, the determiner 112 of the smartphone 100 refers to the log memory 121 and determines whether or not the value of the latest (most recent) log data of "output voltage of battery" is less than the voltage reference value (step S401). Step S401 is also referred to as a determination step. Herein, a value of the log data of "output voltage of battery" of less than the voltage reference value means that a battery level recorded as log data is 6 or 7.

If the value of the latest log data of "output voltage of battery" is equal to or more than the voltage reference value (No in step S401), the processor 110 clears the variable "electricity generation flag" to "0" (step S402) and ends the electricity generation status determination process. If the value of the latest log data of "output voltage of battery" is less than the voltage reference value (Yes in step S401), the determiner 112 determines whether or not the value of the variable "electricity generation flag" is "1" (step S403).

If the value of the variable "electricity generation flag" is not "1" (No in step S403), the determiner 112 refers to the log memory 121 determines whether or not the peak value of the log data of "current generated from solar cell" over the past one month is less than the normal electricity generation reference value (step S404). Step S404 is also referred to as a determination step. Herein, a value of the log data of "current generated from solar cell" of less than the normal electricity generation reference value means that an electricity generation level stored as log data is less than 7. In other words, a peak value of the log data of "current generated from solar cell" over the past one month, of less than the normal electricity generation reference value, means that the solar cell 245 is always incapable of generating even a current in an environment just under a fluorescent lamp over the past one month.

If the peak value of the log data of "current generated from solar cell" over the past one month is equal to or more than the normal electricity generation reference value (No in step S404), the processor 110 ends the electricity generation status determination process.

If the peak value of the log data of "current generated from solar cell" over the past one month is less than the normal electricity generation reference value (Yes in step S404), the information notifier 113 displays, on the display 131, charge guidance as illustrated in FIG. 12 (step S405). Step S405 is also referred to as a notification step. The processor 110 sets the variable "electricity generation flag" to "1", sets a variable "electricity generation determination date" to a current date (date on which the electronic timepiece 200 is connected to the smartphone 100) (step S406), and ends the electricity generation status determination process.

If, in step S403, the value of the variable "electricity generation flag" is "1" (Yes in step S403), the determiner 112 determines whether or not a lapse between the date set to the variable "electricity generation determination date" and a current date is one or more months (step S407). Step S407 is also referred to as a determination step. If the lapse is not one or more months (No in step S407), the processor 110 ends the electricity generation status determination process.

If the lapse between the date set to the variable "electricity generation determination date" and the current date is one or more months (Yes in step S407), the determiner 112 refers to the log memory 121 and determines whether or not the peak value of the log data of "current generated from solar cell" over the past one month is less than the normal electricity generation reference value (step S408). Step S408 is also referred to as a determination step. If the peak value of the log data of "current generated from solar cell" over the past one month is equal to or more than the normal electricity generation reference value (No in step S408), the processor 110 clears the variable "electricity generation flag" to "0" (step S409) and ends the electricity generation status determination process.

If the peak value of the log data of "current generated from solar cell" over the past one month is less than the normal electricity generation reference value (Yes in step S408), the information notifier 113 displays, on the display 131, charge guidance on the need for confirming improvement as illustrated in FIG. 14 (step S410) and waits for an input about the presence or absence of the improvement from a user (touch of "HERE" or "OK"). Step S410 is also referred to as a notification step. The input can be acquired through the touch panel included in the operator 132.

The processor 110 determines whether or not the input from the user is "not improved" (touch of "HERE") (step S411). If the input from the user is not "not improved" (that is, "OK") (No in step S411), the processor 110 ends the electricity generation status determination process.

Figure 17:
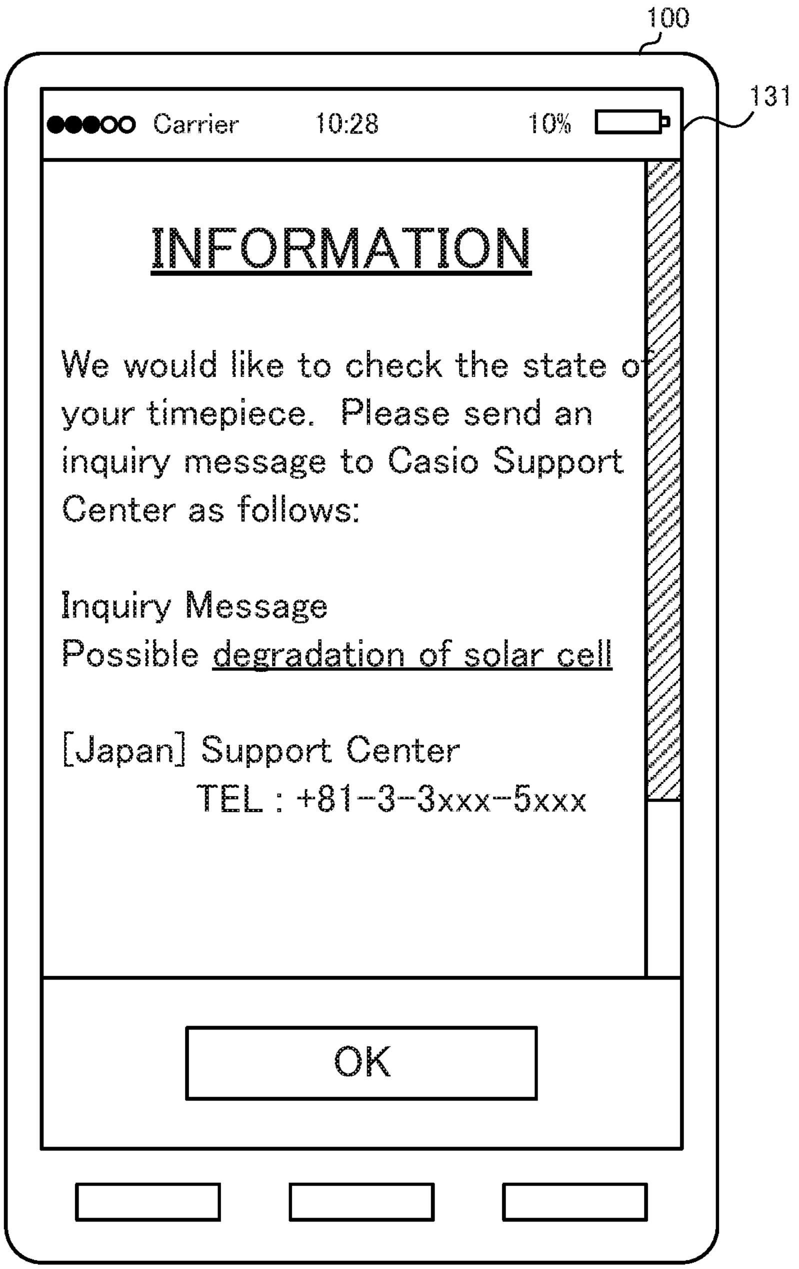
FIG. 17 is a view illustrating another example of a display of a support center in the electricity generation status determination process according to Embodiment 1.

If the input from the user is "not improved" (that is, "HERE") (Yes in step S411), the processor 110 clears the variable "electricity generation flag" to "0" (step S412), and the information notifier 113 displays a support center indicating the possibility of the degradation of the solar cell, as illustrated in FIG. 17, (third notification) on the display 131 (step S413) and ends the electricity generation status determination process.

The electricity generation status determination process has been described above. In the electricity generation status determination process, the smartphone 100 can provide notification of advice information for favorable charge when the amount of charge of the electronic timepiece 200 is insufficient for a long period. If the amount of charge of the electronic timepiece 200 is still insufficient for a long period after the notification of the advice information, the smartphone 100 outputs a message for confirming whether or not the insufficient amount of charge has been improved. The smartphone 100 can provide notification of the possibility of the degradation of the solar cell if acquiring an answer that the insufficient amount of charge has not been improved.

Figure 18:
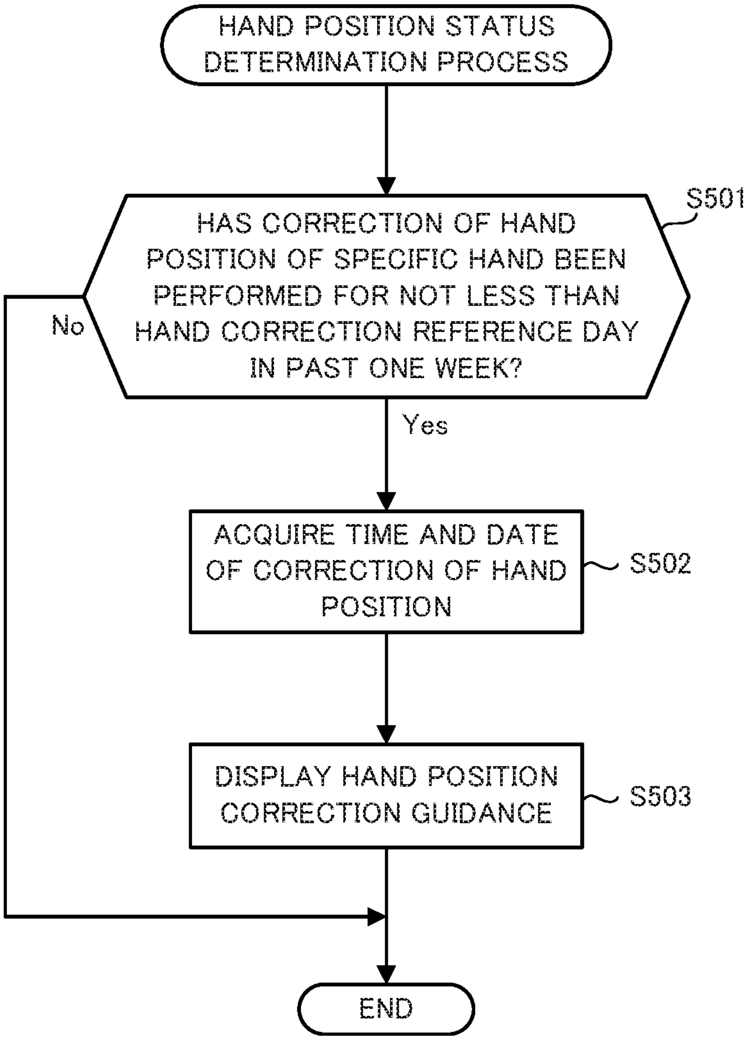
FIG. 18 is a flowchart of a hand position status determination process according to Embodiment 1.

In a case in which the smartphone 100 fails to acquire the log data of the electronic timepiece 200 for not less than one month (status determination reference period) (in a case in which the previous log acquisition date is not less than one month (status determination reference period) before), the status of the solar cell of the electronic timepiece 200 is more likely to be incapable of being accurately determined. In this case, therefore, the overall electricity generation status determination process may be skipped (electricity generation status determination process may be ended without any processing). The hand position status determination process executed in step S203 of FIG. 10 will now be described with reference to FIG. 18.

In the hand position status determination process, first, the determiner 112 of the smartphone 100 refers to the log memory 121 and determines whether or not the automatic correction of the hand position of a specific hand (second hand, minute hand, or hour hand) has been performed for not less than a hand correction reference day (for example, five days) in the log data of "automatic correction of hand position" in a past hand correction determination period (for example, one week) (step S501). Step S501 is also referred to as a determination step. If the automatic correction of the hand position of the specific hand has not been performed for not less than the hand correction reference day (No in step S501), the processor 110 ends the hand position status determination process.

If the automatic correction of the hand position of the specific hand has been performed for not less than the hand correction reference day (Yes in step S501), the information notifier 113 acquires information about the time and date of the automatic correction of the hand position on the basis of the log data of "automatic correction of hand position" stored in the log memory 121 in the past hand correction determination period (step S502). When the time and date of the correction have a feature (the correction in the morning, the correction on a weekday, or the like) in the acquisition, the feature also is desirably acquired.

Figure 19:
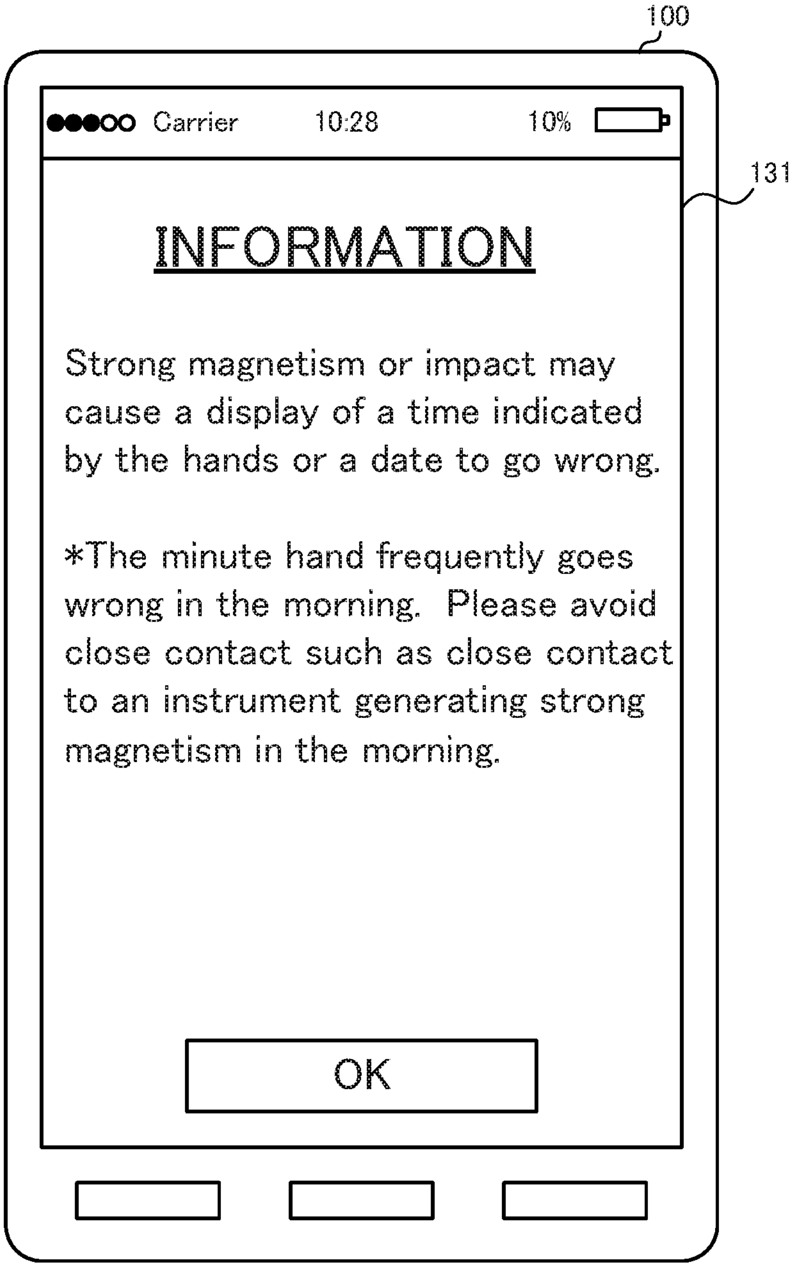
FIG. 19 is a view illustrating an example of a display of hand position correction guidance according to Embodiment 1.

The information notifier 113 displays hand position correction guidance on the display 131 (step S503). Step S503 is also referred to as a notification step. The hand position correction guidance is a screen for providing notification of a wrong hand and advice for preventing the hand from going wrong (fourth notification), as illustrated in FIG. 19. The processor 110 ends the hand position status determination process. It is desirable to also display information about the time and date of the automatic correction of the hand position acquired in step S502 or information about the feature of the time and date of the correction, in the display of the hand position correction guidance in step S503. FIG. 19 is an example of a display of a case in which the automatic correction of the hand position is performed at a time and date only in the morning.

The hand position status determination process has been described above. In the hand position status determination process, the smartphone 100 can provide notification of advice information for preventing a hand from going wrong when the hand position of the electronic timepiece 200 frequently goes wrong.

Figure 10:
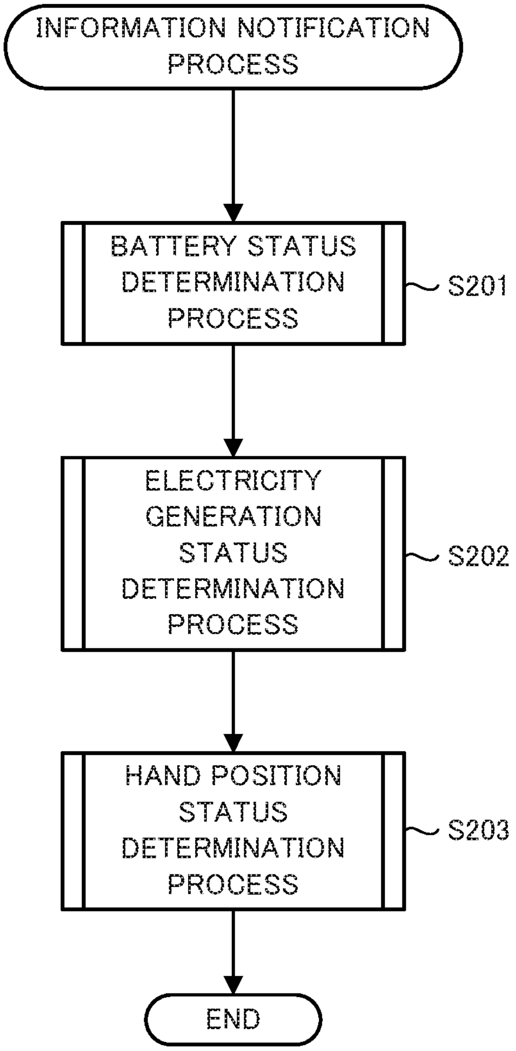
FIG. 10 is a flowchart of an information notification process according to Embodiment 1.
Figure 11:
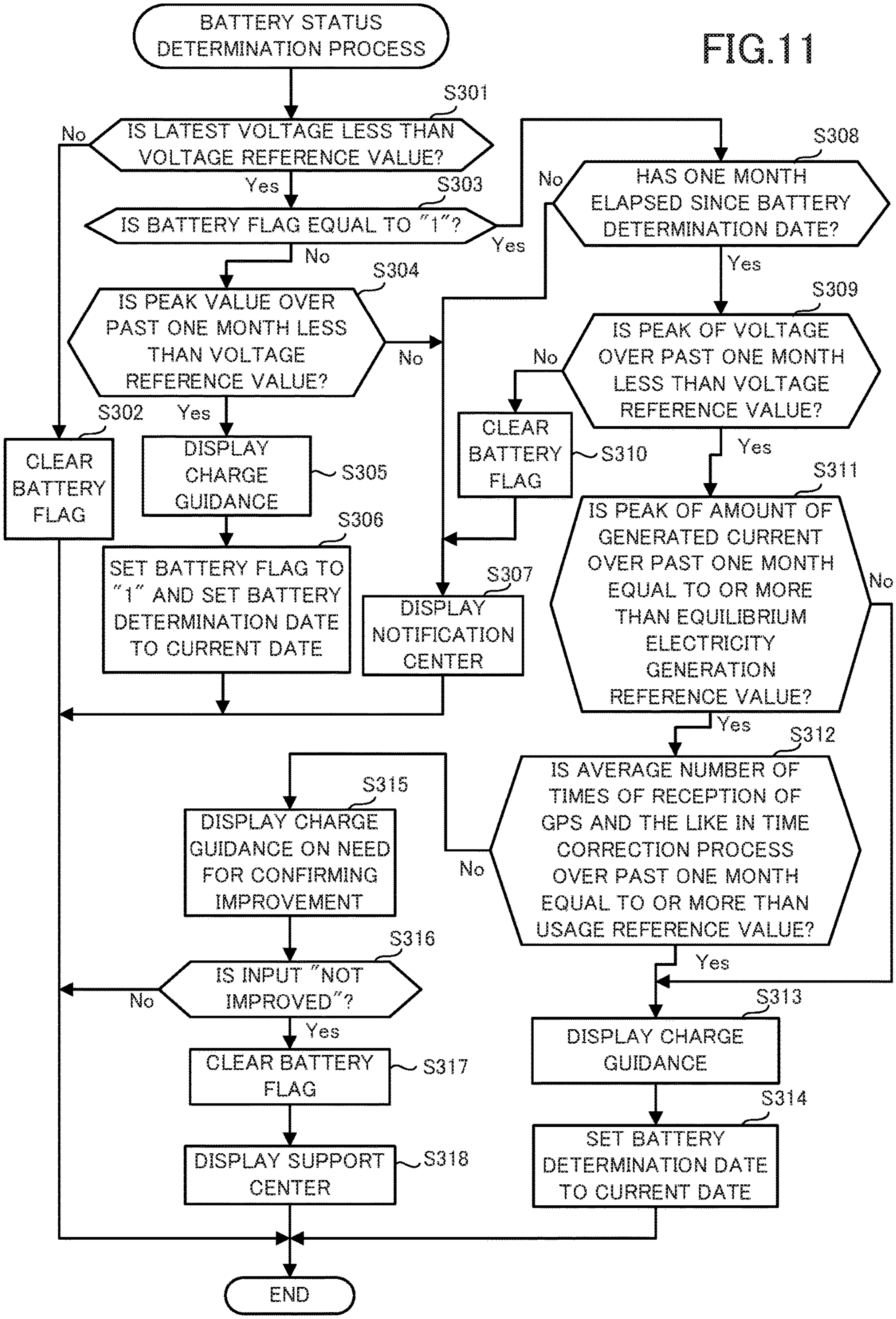
FIG. 11 is a flowchart of a battery status determination process according to Embodiment 1.

Each status determination process executed in each step of the information notification process illustrated in FIG. 10 has been described above. The smartphone 100 can determine the usage status of the electronic timepiece 200 and can notify a user of appropriate information corresponding to the usage status in the information notification process, as described above.

Alternative Example of Embodiment 1

In the information notification process illustrated in FIG. 10, a user is notified of guidance on charge and guidance on magnetism. However, guidance of which notification is provided is not necessarily limited to such types of guidance. Thus, an alternative example of Embodiment 1 will be described in which notification of guidance on time correction is also provided.

Figure 20:
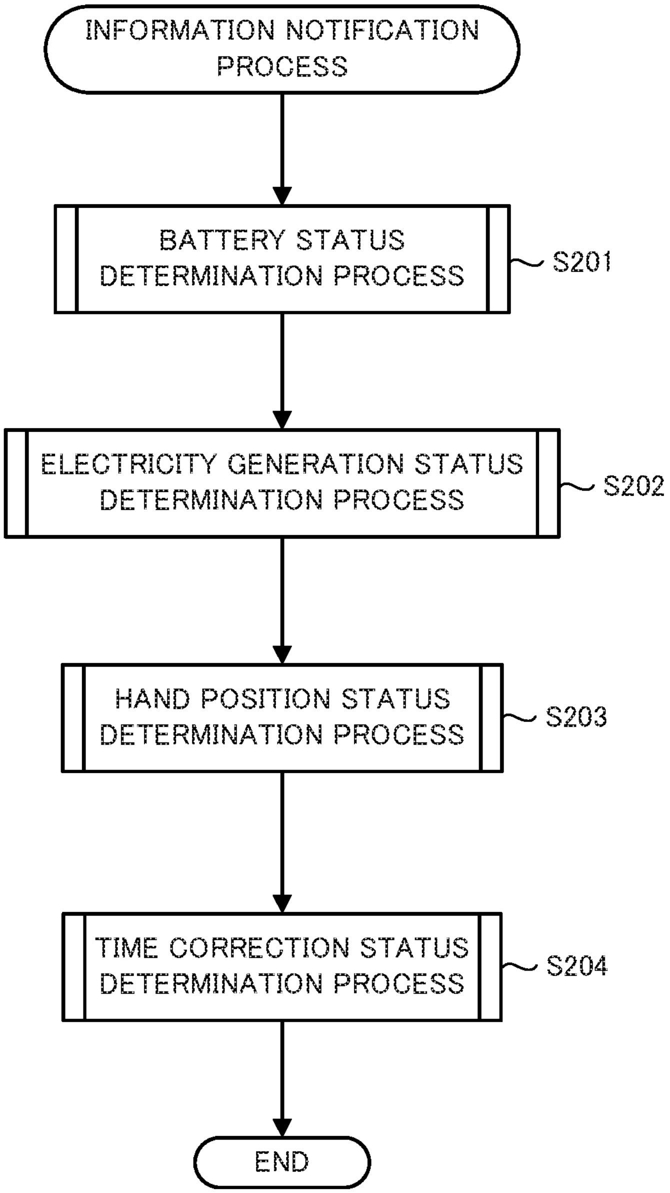
FIG. 20 is a flowchart of an information notification process according to an alternative example of Embodiment 1 of the present disclosure.

An information notification process according to the alternative example of Embodiment 1 has a process content obtained by adding a time correction status determination process (step S204) to the information notification process of Embodiment 1 (FIG. 10), as illustrated in FIG. 20. There is no other different point between the information notification process according to the alternative example of Embodiment 1 and the information notification process of Embodiment 1, than the time correction status determination process (step S204).

Figure 21:
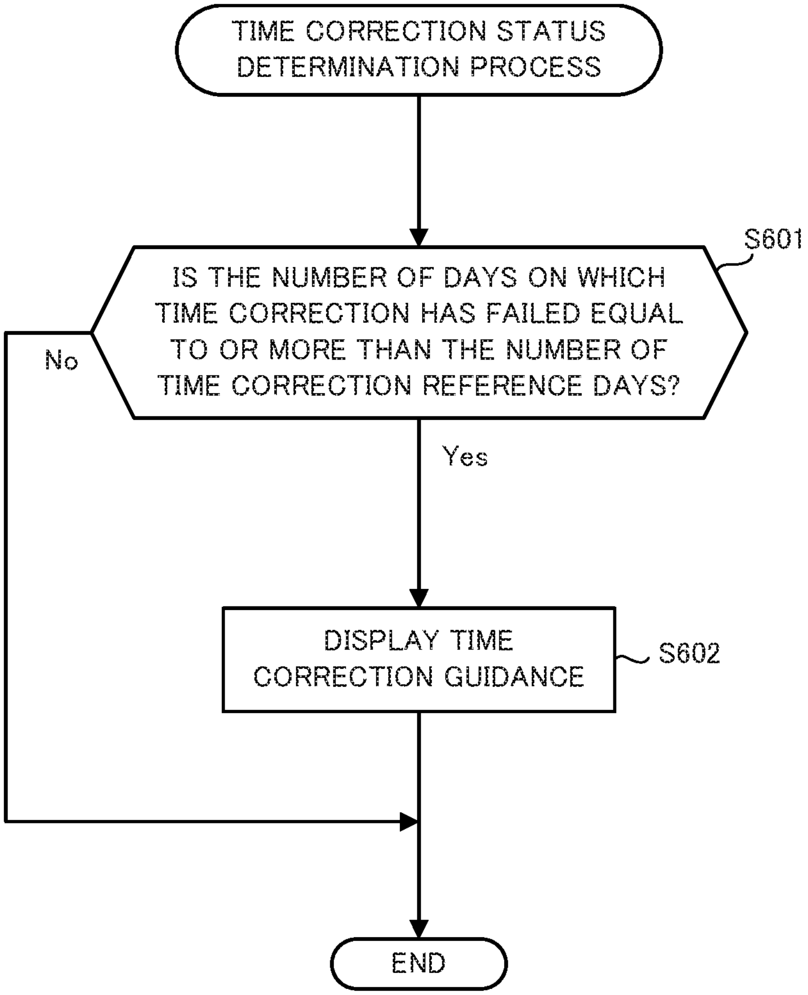
FIG. 21 is a flowchart of a time correction status determination process according to an alternative example of Embodiment 1.

Thus, the time correction status determination process will be described with reference to FIG. 21. First, the determiner 112 of the smartphone 100 refers to the log memory 121 and determines whether or not the number of days on which time correction has failed is equal to or more than the number of time correction reference days (for example, one week) from the log data of "time correction process" (step S601). Step S601 is also referred to as a determination step. If time correction has succeeded on the past days of which the number is less than the number of the time correction reference days (No in step S601), the processor 110 ends the time correction status determination process.

Figure 22:
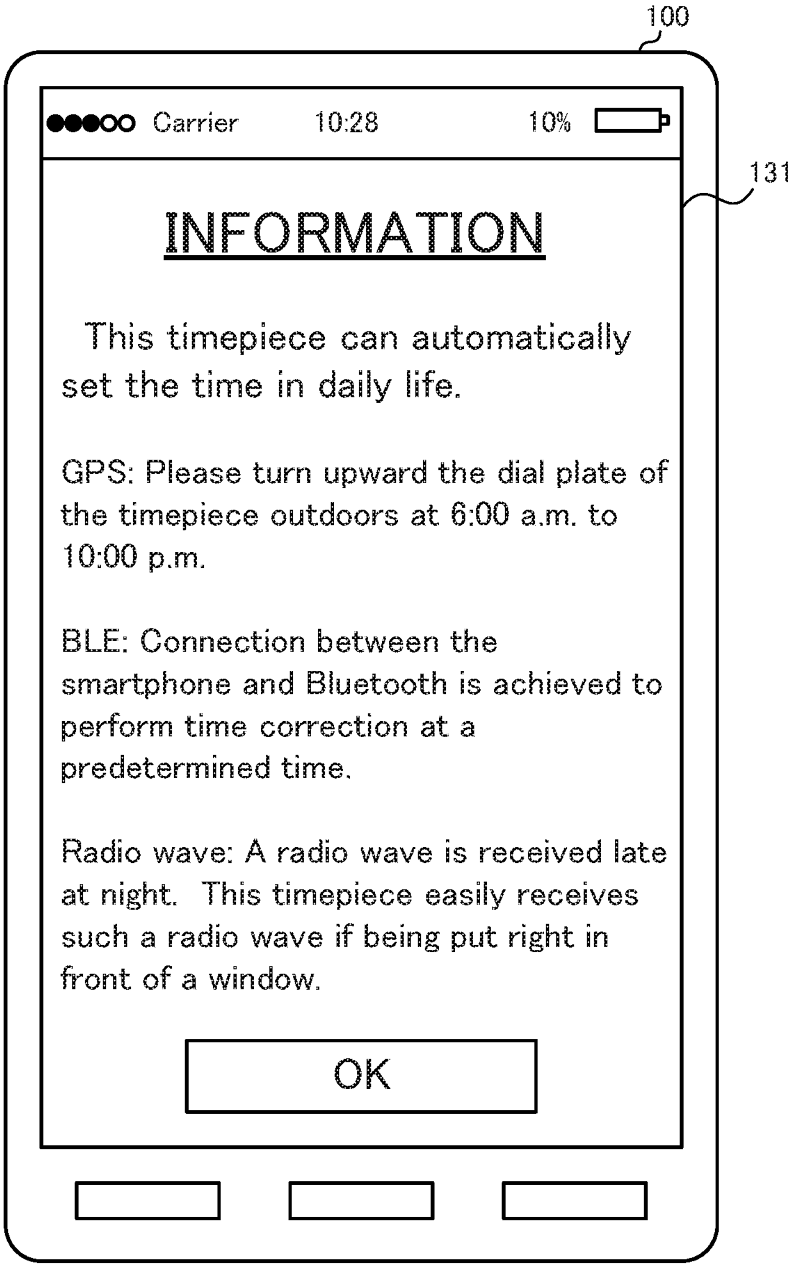
FIG. 22 is a view illustrating an example of a display of time correction guidance according to an alternative example of Embodiment 1.

If the number of days on which time correction has failed is equal to or more than the number of the time correction reference days (Yes in step S601), the information notifier 113 displays time correction guidance on the display 131 (step S602). Step S602 is also referred to as a notification step. The time correction guidance is a screen for providing notification of advice for accurately performing time correction (fifth notification), as illustrated in FIG. 22. The processor 110 ends the time correction status determination process.

In the time correction status determination process described above, the smartphone 100 can provide notification of advice information for accurately performing time correction if the process of correcting the time of the electronic timepiece 200 frequently fails.

Embodiment 2

The smartphone 100 according to Embodiment 1 described above can notify a user of necessary information in the information notification process. Embodiment 2 will now be described in which not only a user but also an electronic timepiece 200 can be notified of necessary information. In an information notification system 1001 according to Embodiment 2, the smartphone 100 in the information notification system 1000 according to Embodiment 1 is replaced with a smartphone 101. The information notification system 1001 includes the smartphone 101 and the electronic timepiece 200 as illustrated in FIG. 1.

Figure 23:
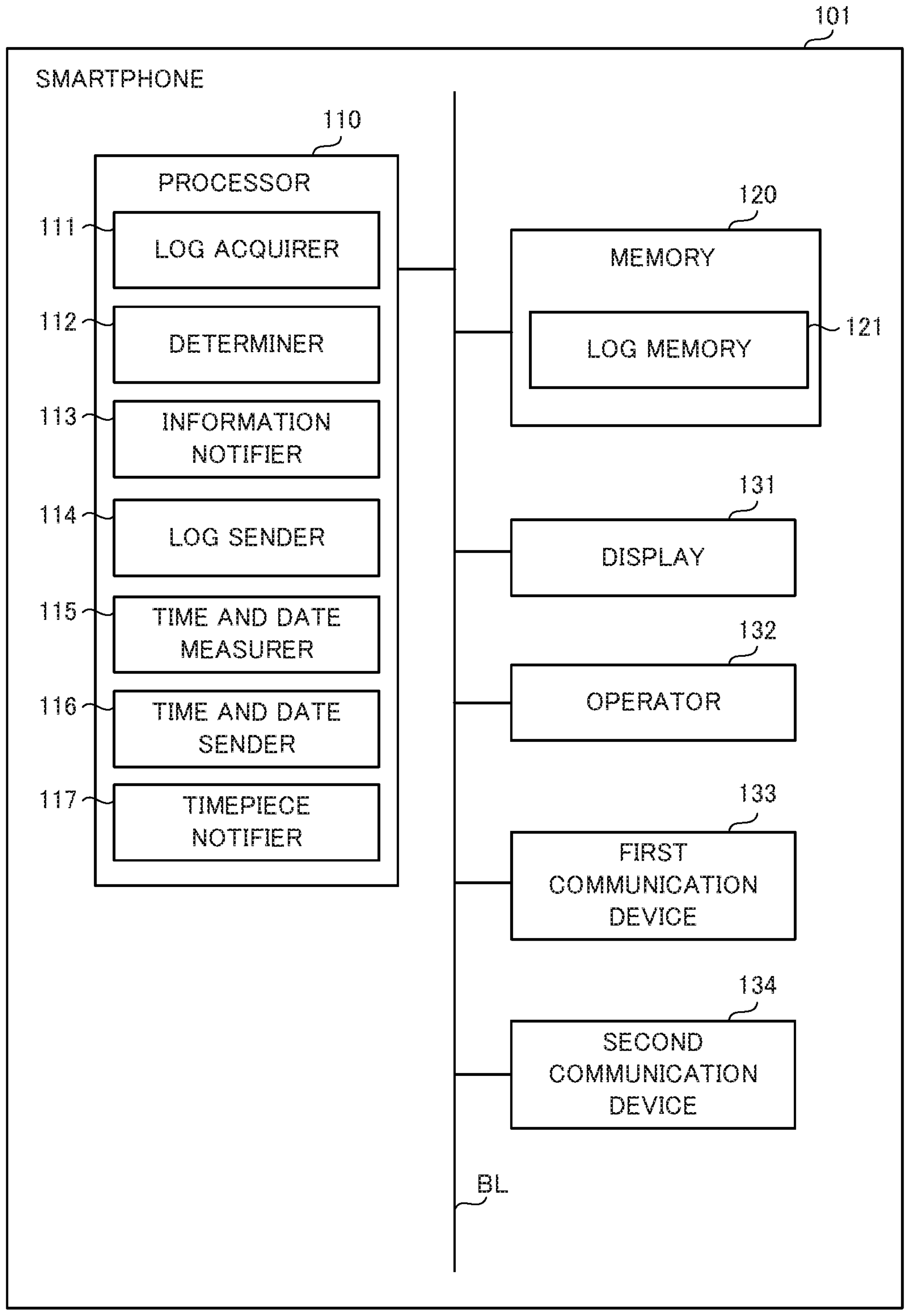
FIG. 23 is a block diagram illustrating the functional configuration of a smartphone according to Embodiment 2 of the present disclosure.

The smartphone 101 according to Embodiment 2 has a configuration in which a timepiece notifier 117 is added to the smartphone 100 according to Embodiment 1 (FIG. 2), as illustrated in FIG. 23. The timepiece notifier 117 sends information, of which notification should be provided to the electronic timepiece 200, to the electronic timepiece 200 via a first communication device 133 on the basis of the status of the electronic timepiece 200, determined by a determiner 112.

Figure 24:
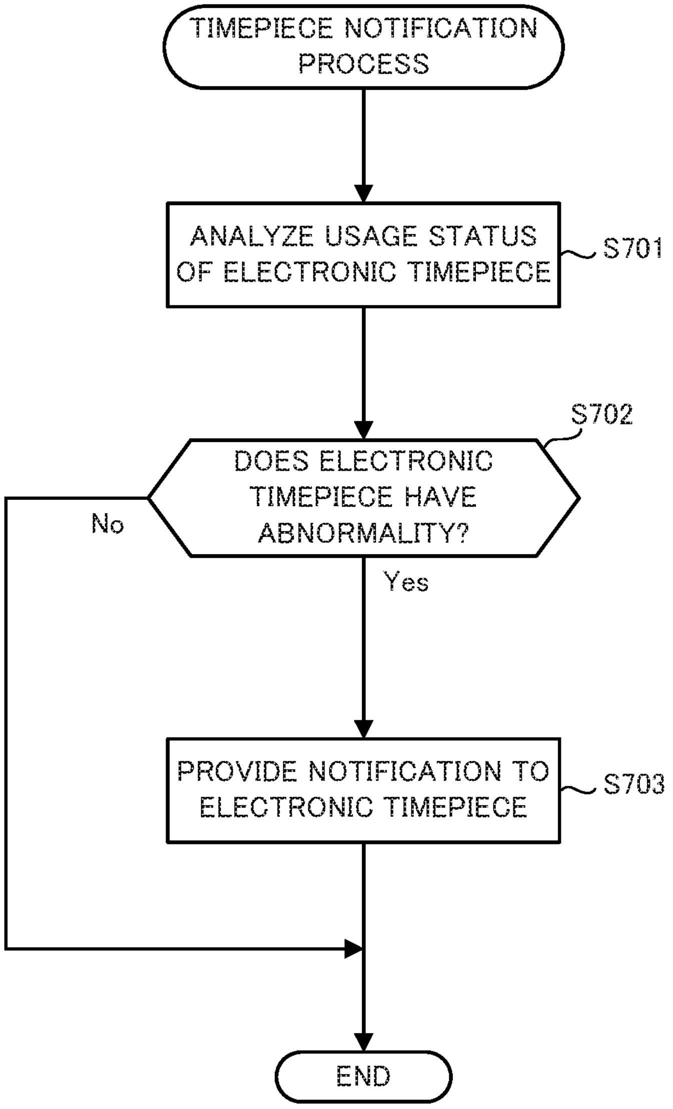
FIG. 24 is a flowchart of a timepiece notification process according to Embodiment 2.

Like the smartphone 100, the smartphone 101 also carries out an initialization process (FIG. 8), a log data acquisition process (FIG. 9), and an information notification process (FIG. 10). In addition to the processes, the smartphone 101 carries out a timepiece notification process in which the electronic timepiece 200 is notified of necessary information. The timepiece notification process will be described with reference to FIG. 24. Like the information notification process, the execution of the timepiece notification process is started when the log data acquisition process described above is ended. A process may be considered to be actually carried out in which notification is also provided to the electronic timepiece 200 when guidance is displayed on a display 131 in each determination process of the information notification process described above.

In the timepiece notification process, first, the processor 110 of the smartphone 101 refers to a log memory 121 and analyzes the usage status of the electronic timepiece 200 (step S701). The process of the analysis is a process similar to the various processes in each determination process of the information notification process described above.

The determiner 112 determines whether or not the result of the analysis performed by the processor 110 in step S701 is "electronic timepiece has abnormality" (step S702). Step S702 is also referred to as a determination step. For example, a case in which a process in which an information notifier 113 displays various types of guidance is carried out by determination performed by the determiner 112 in the battery status determination process (FIG. 11), electricity generation status determination process (FIG. 16), hand position status determination process (FIG. 18), and time correction status determination process (FIG. 21) described above means that the determiner 112 determines that "electronic timepiece has abnormality."

If the analysis result is not "electronic timepiece has abnormality" (No in step S702), the processor 110 ends the timepiece notification process. If the analysis result is "electronic timepiece has abnormality" (Yes in step S702), the timepiece notifier 117 notifies the electronic timepiece 200 of the abnormality via the first communication device 133 (step S703). Step S703 is also referred to as a time display device notification step. The processor 110 ends a timepiece notification process. Examples of the notification of the abnormality include notifications such as "chronic insufficiency of amount of charge", "frequent going wrong of hand", and "failure in time correction for one or more weeks." The electronic timepiece 200 receives the notification of the abnormality from the smartphone 101 via a short-range communication device 233 and displays the notification on a display included in a display 231. As a result, a user can know a problem occurring in the electronic timepiece 200 only by looking at the electronic timepiece 200 even if not looking at the smartphone 101.

In step S703, the timepiece notifier 117 may send not only the notification of the abnormality but also correction data for correcting various reference values stored in the electronic timepiece 200 in order to sense abnormality. Examples of the various reference values include a reference value for a battery level value, a reference value for an electricity generation level, and a reference value for a sensor that senses a wrong hand. For example, when notification of abnormality is frequently provided in the case of the various current reference values, the frequency of the notification of the abnormality can be lowered by sending correction data for correcting the various reference values in step S703.

The embodiments have been described above; however, since the embodiments are merely illustrative, the configurations and process contents of the information notification systems 1000 and 1001, and the like are not limited to those described in the embodiments. For example, a message displayed in a guidance display may be changed as appropriate. As the time intervals of storage of log data stored in the log memory 121, the log memory 221, and the log memory 321, the above-described values and the values described in FIG. 3, FIG. 5, and FIG. 7 are merely illustrative and may be changed as appropriate. Whether or not to use the time signal function of the electronic timepiece 200, whether or not to use the alarm function of the electronic timepiece 200, a time during which alarm tone is output when the alarm is used, times at and during which lighting is performed, whether or not to use a stopwatch function, and the like may be recorded as log data. A process of more strictly analyzing the usage tendency of a user by using the log data may be allowed to be reflected in the various determination processes of the information notification process. In such a manner, information about a guidance display in the case of notifying a user of the information can be further detailed and can be made easy to find. Each of the information notification systems 1000 and 1001 may include an optional battery-operated device instead of the electronic timepiece 200. In such a case, the smartphones 100 and 101 can also display charge guidance and the like with regard to the devices as well as can change log data and guidance displays depending on the functions of the devices.

In the embodiments described above, the examples are described in which the processors 110, 210, and 310 perform controlling operation with the CPUs. However, such controlling operation is not limited to software control with a CPU. Part or the whole of the controlling operation may be performed using a hardware configuration such as a dedicated wired logic. Each of the processors 110, 210, and 310 may operate, with a single CPU, as a section in the functional configuration described above or may operate, with plural CPUs, as each section in the functional configuration.

The embodiments are described above in which the programs executed by the processors 110, 210, and 310 are stored in advance in the ROMs of the memories 120, 220, and 320. However, it is also acceptable to store such a program in a non-transitory computer-readable recording medium such as a universal serial bus (USB) memory, a flexible disk, a compact disc read only memory (CD-ROM), a hard disk drive (HDD), a digital versatile disc (DVD), or a magneto-optical disc (MO), to distribute the recording medium, and to read the program into a computer to install the program onto the computer, thereby configuring the computer that is capable of realizing each of the functions described above. In a case in which, for example, each function is realized by dividing the function between an operating system (OS) and an application or by cooperation between the OS and the application, only the other portion than the OS may be stored in the non-transitory recording medium.

In addition, each program piggybacked onto a carrier wave may also be distributed through a communication network. For example, such a program may be uploaded to a bulletin board system (BBS) on the communication network and may be enabled to be downloaded through the network. The smartphones 100 and 101, the electronic timepiece 200, and the server 300 may be configured to download and start such programs and to execute the programs in a manner similar to that of another application program under control from the OS, thereby enabling the above-described processes to be executed.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. An information notification method performed by an information notification device comprising: a receiver that receives data from a time display device; and a display, the information notification method comprising:

acquiring log data of the time display device from the time display device by the receiver;

determining a usage status of the time display device based on the acquired log data; and providing, via the display, information corresponding to the determined usage status of the time display device; wherein the determining comprises determining whether or not a voltage of a battery of the time display device continues to be less than a voltage reference value in a status determination reference period; and the providing comprises providing a first notification if the voltage of the battery of the time display device is determined to continue to be less than the voltage reference value during the status determination reference period;

the determining further comprises determining whether or not the voltage of the battery of the time display device further continues to be less than the voltage reference value in the status determination reference period after providing the first notification; and the providing further comprises providing a second notification if the voltage of the battery of the time display device is determined to further continue to be less than the voltage reference value in the status determination reference period after providing the first notification.

2. An information notification method performed by an information notification device comprising: a receiver that receives data from a time display device; and a display, the information notification method comprising:

acquiring log data of the time display device from the time display device by the receiver;

determining a usage status of the time display device based on the log data acquired in the log acquisition step; and providing, via the display, information corresponding to the determined usage status of the time display device;

wherein the determining comprises determining whether or not an amount of current generated from a solar cell of the time display device continues to be less than a normal electricity generation reference value in a status determination reference period; and the providing comprises providing a first notification if the amount of the current generated from the solar cell of the time display device is determined to continue to be less than the normal electricity generation reference value in the status determination reference period.

3. The information notification method according to claim 1, wherein the determining comprises determining whether or not an amount of current generated from a solar cell of the time display device continues to be less than a normal electricity generation reference value in a status determination reference period; and the providing comprises providing the first notification if the amount of current generated from the solar cell of the time display device is determined to continue to be less than the normal electricity generation reference value in the status determination reference period.

4. The information notification method according to claim 1, wherein the determining comprises determining whether or not an amount of current generated from a solar cell of the time display device continues to be less than a normal electricity generation reference value in a status determination reference period; and the providing comprises providing the first notification if the amount of the current generated from the solar cell of the time display device is determined to continue to be less than the normal electricity generation reference value in the status determination reference period.

5. The information notification method according to claim 2, wherein the determining comprises determining whether or not an amount of current generated from the solar cell of the time display device further continues to be less than the normal electricity generation reference value in the status determination reference period after providing the first notification; and the providing comprises providing a second notification if the amount of the current generated from the solar cell of the time display device is determined to further continue to be less than the normal electricity generation reference value in the status determination reference period after providing the first notification.

6. The information notification method according to claim 3, wherein the determining comprises determining whether or not an amount of current generated from the solar cell of the time display device further continues to be less than the normal electricity generation reference value in the status determination reference period after providing the first notification; and the providing comprises providing a second notification if the amount of the current generated from the solar cell of the time display device is determined to further continue to be less than the normal electricity generation reference value in the status determination reference period after providing the first notification.

7. The information notification method according to claim 4, wherein the determining comprises determining whether or not an amount of current generated from the solar cell of the time display device further continues to be less than the normal electricity generation reference value in the status determination reference period after providing the first notification; and the providing comprises providing a second notification if the amount of the current generated from the solar cell of the time display device is determined to further continue to be less than the normal electricity generation reference value in the status determination reference period after providing the first notification.

8. An information notification method performed by an information notification device comprising: a receiver that receives data from a time display device; and a display, the information notification method comprising:

acquiring log data of the time display device from the time display device by the receiver;

determining a usage status of the time display device based on the log data acquired in the log acquisition step; and providing, via the display, information corresponding to the determined usage status of the time display device;

wherein the determining comprises determining whether or not the time display device performs automatic correction of a hand position for not less than a hand correction reference day in a hand correction determination period; and the providing comprises providing a first notification if the time display device is determined to perform the automatic correction of the hand position for not less than the hand correction reference day in the hand correction determination period.

9. The information notification method according to claim 1, wherein the determining comprises determining whether or not the time display device performs automatic correction of a hand position for not less than a hand correction reference day in a hand correction determination period; and the providing comprises providing a second notification if the time display device is determined to perform the automatic correction of the hand position for not less than the hand correction reference day in the hand correction determination period.

10. The information notification method according to claim 1, wherein the determining comprises determining whether or not the time display device performs automatic correction of a hand position for not less than a hand correction reference day in a hand correction determination period; and the providing comprises providing a third notification if the time display device is determined to perform the automatic correction of the hand position for not less than the hand correction reference day in the hand correction determination period.

11. The information notification method according to claim 2, wherein the determining comprises determining whether or not the time display device performs automatic correction of a hand position for not less than a hand correction reference day in a hand correction determination period; and the providing comprises providing a second notification if the time display device is determined to perform the automatic correction of the hand position for not less than the hand correction reference day in the hand correction determination period.

12. The information notification method according to claim 3, wherein the determining comprises determining whether or not the time display device performs automatic correction of a hand position for not less than a hand correction reference day in a hand correction determination period; and the providing comprises providing a second notification if the time display device is determined to perform the automatic correction of the hand position for not less than the hand correction reference day in the hand correction determination period.

13. The information notification method according to claim 4, wherein the determining comprises determining whether or not the time display device performs automatic correction of a hand position for not less than a hand correction reference day in a hand correction determination period; and the providing comprises providing a third notification if the time display device is determined to perform the automatic correction of the hand position for not less than the hand correction reference day in the hand correction determination period.

14. The information notification method according to claim 5, wherein the determining comprises determining whether or not the time display device performs automatic correction of a hand position for not less than a hand correction reference day in a hand correction determination period; and the providing comprises providing a third notification if the time display device is determined to perform the automatic correction of the hand position for not less than the hand correction reference day in the hand correction determination period.

15. An information notification method performed by an information notification device comprising: a receiver that receives data from a time display device; and a display, the information notification method comprising:

acquiring log data of the time display device from the time display device by the receiver;

determining a usage status of the time display device based on the log data acquired in the log acquisition step; and providing, via the display, information corresponding to the determined usage status of the time display device;

wherein the determining comprises determining whether or not the number of days on which time correction fails in a process of correcting a time of the time display device is equal to or more than the number of time correction reference days; and the providing comprises providing a first notification if the determined number of the days on which the time correction fails is equal to or more than the number of the time correction reference days.

16. The information notification method according to claim 1, further comprising:

notifying the time display device of information corresponding to the determined usage status of the time display device.

17. An information notification device comprising:

a receiver that receives data from a time display device;

a processor; and a display, wherein the processor is configured to:

acquire log data of the time display device from the time display device by the receiver, determine a usage status of the time display device based on the acquired log data, and provide, via the display, a notification of information corresponding to the determined usage status of the time display device;

wherein the determining of the usage data comprises determining whether or not a voltage of a battery of the time display device continues to be less than a voltage reference value in a status determination reference period; and the providing of the notification comprises providing a first notification if the voltage of the battery of the time display device is determined to continue to be less than the voltage reference value during the status determination reference period;

the determining of the usage data further comprises determining whether or not the voltage of the battery of the time display device further continues to be less than the voltage reference value in the status determination reference period after providing the first notification; and the providing of the notification further comprises providing a second notification if the voltage of the battery of the time display device is determined to further continue to be less than the voltage reference value in the status determination reference period after providing the first notification.

18. A non-transitory computer-readable recording medium in which a program readable by a computer of an information notification device is recorded, the information notification device comprising: a receiver in wireless communication with a time display device; and a display, wherein the computer-readable recording medium storing instructions that cause a computer to at least perform:

acquiring log data of the time display device from the time display device by the receiver;

determining a usage status of the time display device based on the acquired log data; and providing, via the display, notification of information corresponding to the determined usage status of the time display device;

wherein the determining comprises determining whether or not a voltage of a battery of the time display device continues to be less than a voltage reference value in a status determination reference period; and the providing comprises providing a first notification if the voltage of the battery of the time display device is determined to continue to be less than the voltage reference value during the status determination reference period;

the determining further comprises determining whether or not the voltage of the battery of the time display device further continues to be less than the voltage reference value in the status determination reference period after providing the first notification; and the providing further comprises providing a second notification if the voltage of the battery of the time display device is determined to further continue to be less than the voltage reference value in the status determination reference period after providing the first notification.

* * * * *